(12) United States Patent
Malladi

(10) Patent No.: US 11,683,028 B2
(45) Date of Patent: Jun. 20, 2023

(54) RADIO FREQUENCY SWITCHES WITH VOLTAGE EQUALIZATION

(71) Applicant: NXP USA, Inc., Austin, TX (US)

(72) Inventor: Venkata Naga Koushik Malladi, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 97 days.

(21) Appl. No.: 17/466,322

(22) Filed: Sep. 3, 2021

(65) Prior Publication Data

US 2022/0286123 A1  Sep. 8, 2022

Related U.S. Application Data

(63) Continuation-in-part of application No. 17/190,702, filed on Mar. 3, 2021.

(51) Int. Cl.
  *H03K 17/00* (2006.01)
  *H03K 17/041* (2006.01)
  *H04B 1/44* (2006.01)

(52) U.S. Cl.
  CPC ......... *H03K 17/04106* (2013.01); *H04B 1/44* (2013.01)

(58) Field of Classification Search
  CPC ... H03K 17/162; H01L 21/84; H01L 27/1203; H04B 1/48
  See application file for complete search history.

(56) References Cited

U.S. PATENT DOCUMENTS

| | | |
|---|---|---|
| 5,808,322 A | 9/1998 | Nicholson et al. |
| 7,161,197 B2 | 1/2007 | Nakatsuka et al. |
| 7,504,677 B2 | 3/2009 | Glass et al. |
| 7,532,094 B2 | 5/2009 | Arnold |

(Continued)

FOREIGN PATENT DOCUMENTS

| | | |
|---|---|---|
| DE | 102008004861 A1 | 7/2009 |
| DE | 102008004861 A1 | 7/2009 |

OTHER PUBLICATIONS

U.S. Appl. No. 16/944,612, filed Jul. 31, 2020; Inventor: Venkata Naga Koushik Malladi; Title: "Switch Circuits With Parallel Transistor Stacks and Methods of Their Operation".
Non Final Office Action; U.S. Appl. No. 16/944,612; 14 pages; dated Sep. 10, 2021.
Notice of Allowance, dated Apr. 14, 2022; for U.S. Appl. No. 16/944,612, 21 Pages.
Non Final Office Action; U.S. Appl. No. 17/190,702; 15 pages; dated Jul. 6, 2022.

(Continued)

*Primary Examiner* — Md K Talukder
(74) *Attorney, Agent, or Firm* — Sherry W. Gourlay

(57) ABSTRACT

Embodiments described herein include radio frequency (RF) switches that may provide increased power handling capability. In general, the embodiments described herein can provide this increased power handling by equalizing the voltages across transistors when the RF switch is open. Specifically, the embodiments described herein can be implemented to equalize the source-drain voltages across each field effect transistor (FET) in a FET stack that occurs when the RF switch is open and not conducting current. This equalization can be provided by using one or more compensation circuits to couple one or more gates and transistor bodies in the FET stack in a way that at least partially compensates for the effects of parasitic leakage currents in the FET stack. In addition, multiple FET stacks are implemented in parallel in at least some switch branches to improve settling time for the branch.

20 Claims, 12 Drawing Sheets

(56) References Cited

U.S. PATENT DOCUMENTS

| | | | |
|---|---|---|---|
| 7,983,627 | B2 | 7/2011 | Adler et al. |
| 8,008,988 | B1 | 8/2011 | Yang et al. |
| 8,174,050 | B2 | 5/2012 | Boles et al. |
| 8,401,496 | B2 | 3/2013 | Goto et al. |
| 8,451,044 | B2* | 5/2013 | Nisbet ............... H03K 17/687 333/104 |
| 8,536,636 | B2 | 9/2013 | Englekirk |
| 8,723,260 | B1 | 5/2014 | Carroll et al. |
| 8,824,974 | B2 | 9/2014 | Nakajima et al. |
| 8,963,618 | B2 | 2/2015 | Keane et al. |
| 9,438,223 | B2* | 9/2016 | de Jongh ............ H03K 17/162 |
| 9,484,973 | B1 | 11/2016 | Carroll et al. |
| 9,595,951 | B2 | 3/2017 | Sprinkle et al. |
| 9,780,090 | B2 | 10/2017 | Fraser et al. |
| 9,893,722 | B2 | 2/2018 | Mokalla |
| 10,326,018 | B1* | 6/2019 | Malladi ............... H01L 21/8234 |
| 10,326,440 | B1 | 6/2019 | Malladi |
| 10,784,862 | B1* | 9/2020 | Malladi ............... H03K 17/102 |
| 10,897,246 | B2 | 1/2021 | Scott et al. |
| 10,972,091 | B1 | 4/2021 | Malladi |
| 2006/0217078 | A1 | 9/2006 | Glass et al. |
| 2006/0261912 | A1 | 11/2006 | Miyagi et al. |
| 2006/0270367 | A1* | 11/2006 | Burgener ............... H03F 1/56 455/333 |
| 2007/0102730 | A1 | 5/2007 | Nakatsuka et al. |
| 2008/0242235 | A1 | 10/2008 | Adler et al. |
| 2011/0001543 | A1 | 1/2011 | Kondo et al. |
| 2012/0001230 | A1 | 1/2012 | Takatani |
| 2012/0112832 | A1 | 5/2012 | Kawano et al. |
| 2013/0288617 | A1 | 10/2013 | Kim et al. |
| 2014/0183609 | A1 | 7/2014 | Takatani et al. |
| 2015/0022256 | A1* | 1/2015 | Sprinkle ............. H03K 17/161 327/379 |
| 2015/0116023 | A1 | 4/2015 | Keane et al. |
| 2015/0318852 | A1* | 11/2015 | Hoogzaad ............ H03K 17/687 327/434 |
| 2015/0341026 | A1* | 11/2015 | de Jongh ................ H04B 1/40 327/382 |
| 2016/0285447 | A1 | 9/2016 | Krishnamurthi et al. |
| 2016/0329874 | A1 | 11/2016 | Mohammadpour et al. |
| 2016/0373106 | A1* | 12/2016 | Shah .................. H01L 29/0696 |
| 2017/0317082 | A1 | 11/2017 | Den Hartog et al. |
| 2018/0012962 | A1 | 1/2018 | Yeh et al. |
| 2018/0197881 | A1* | 7/2018 | Scott ................ H01L 29/42384 |
| 2019/0245574 | A1 | 8/2019 | Jo et al. |
| 2019/0267489 | A1 | 8/2019 | Malladi |
| 2019/0267987 | A1 | 8/2019 | Malladi |

OTHER PUBLICATIONS

A. Armstrong; H. Wagner, "A 5-V/sub p-p/100-ps GaAs pulse amplifier IC with improved pulse fidelity," in IEEE Journal of Solid-State Circuits, vol. 27, No. 10, pp. 1476-1481, Oct. 1992.

Final Office Action; U.S. Appl. No. 16/701,927; 12 pages (dated Nov. 25, 2020).

Hsu, H. et al. "Improved GaAs PHEMT T/R Switches Performance with Multi-Gate/Islands Configuration", ResearchGate, 4 pgs. (Jan. 1, 2014).

Keysight U9397A/C, technical document, http://literature.cdn.keysight.com/litweb/pdf/5989-6088EN.pdf., 15 pages; retrieved on Sep. 10, 2019.

Koya, S. et al. "Intergate-Channel-Connected Multi-Gate PHEMT Devices for Antenna Switch Applications", IEEE MTT-S International Microwave Symposium Digest, pp. 1287-1290 (Jun. 2008).

M.Shifrin, et al., High power control components using a new monolithic FET structure, Microwave and Millimeter-wave Monolithic Circuits Symposium, 1989, pp. 51-56.

Non Final Office Action: U.S. Appl. No. 16/566,710; 10 pages (dated Mar. 24, 2020).

Non Final Office Action; U.S. Appl. No. 16/701,927; 9 pages dated Jun. 10, 2020.

Non-Final Office Action dated Oct. 24, 2018 for U.S. Appl. No. 15/907,740 7 pages.

Non-Final Office Action dated Oct. 24, 2018 for U.S. Appl. No. 15/908,009 7 pages.

Notice of Allowance; U.S. Appl. No. 15/907,740; 10 pages (dated Apr. 18, 2019).

Notice of Allowance; U.S. Appl. No. 15/908,009; 10 pages (dated Apr. 17, 2019).

Notice of Allowance; U.S. Appl. No. 16/398,992; 9 pages (dated Jan. 17, 2020).

Notice of Allowance; U.S. Appl. No. 16/566,710; 8 pages (dated Aug. 11, 2020).

Notice of Allowance; U.S. Appl. No. 16/701,927; 8 pages (dated Feb. 8, 2021).

Notice of Allowance; U.S. Appl. No. 16/398,811; 9 pages (dated Dec. 16, 2019).

Val Peterson, 7—Instrumentation, Gallium Arsenide IC Applications Handbook, pp. 225-254, ISBN 9780122577352, Copyright 1995 by Academic Press, Inc.

Notice of Allowance; U.S. Appl. No. 17/190,702; 11 pages; dated Oct. 19, 2022.

* cited by examiner

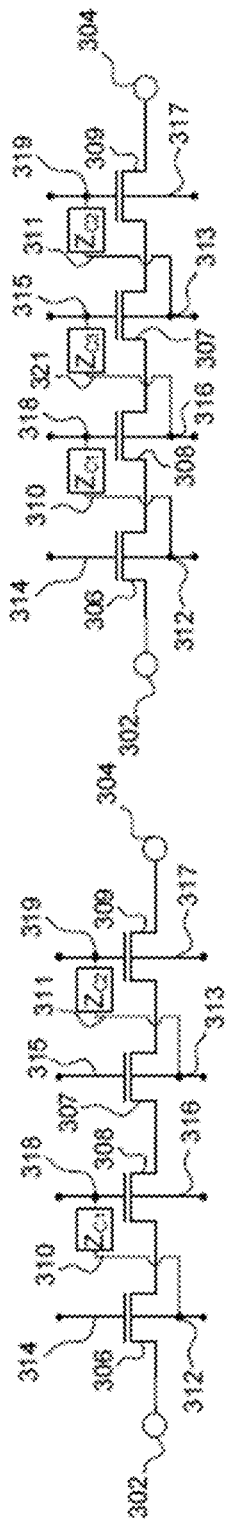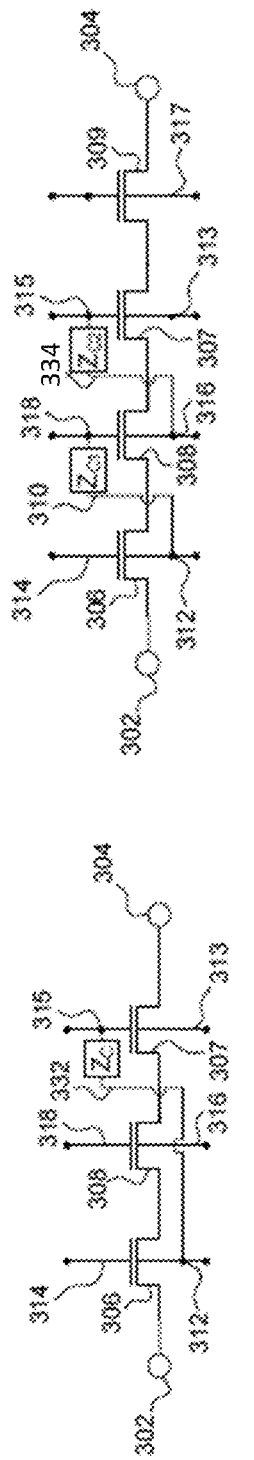

RADIO FREQUENCY SWITCHES WITH VOLTAGE EQUALIZATION

CROSS-REFERENCE TO RELATED APPLICATION

This application is a continuation-in-part of co-pending, U.S. patent application Ser. No. 17/190,702, filed on Mar. 3, 2021, which is a continuation of U.S. Pat. No. 10,972,091, filed on Dec. 3, 2019.

TECHNICAL FIELD

Embodiments of the subject matter described herein relate generally to radio frequency (RF) switches and specifically RF switches that use field effect transistor (FET) stacks.

BACKGROUND

Radio frequency (RF) switches are used extensively in various RF applications, including RF power amplification, RF signal transmission, and RF signal reception. In various applications these RF switches need to provide both high speed switching and high power handling. To facilitate high power handling many RF switches use one or more stacks of field effect transistors (FETs), where each stack includes a series-coupled arrangement of several FETs. In such devices each FET can be a monolithic transistor device that includes a variable-conductivity channel between drain and source terminals, along with one or more gates positioned over the channel. Electrical signals provided to the gates control the conductivity of the channel during operation of the FETs. RF switches implemented with such stacks of FETs can thus provide relatively higher power handling capability.

However, one issue with such RF switches is the ability to provide high power handling capability while maintaining fast switching speed. To provide high power handling it is desirable to implement and operate the RF switches such that a nearly equal voltage is maintained across each FET in series-coupled stack of FETs when the switch is open. Specifically, maintaining a nearly equal voltage across each FET in the stack when the switch is open helps ensure that no one FET in the stack has an excessive source-drain voltage that could lead to breakdown or other failure of that FET. In contrast, if significant non-equal voltages are seen across some FETs then those FETs with higher source-drain voltages can exceed their breakdown voltage and potentially fail while other FETs with lower source-drain voltages are well below their breakdown voltage. Thus, there remains a continuing need for improved RF switches that can maintain a nearly equal voltage across FETs to improve the power handling of the switch while maintaining high speed switching.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

FIGS. 3A, 3B, 3C, and 3D are circuit diagrams of FET stacks in accordance with exemplary embodiments;

DETAILED DESCRIPTION

Figure 1:
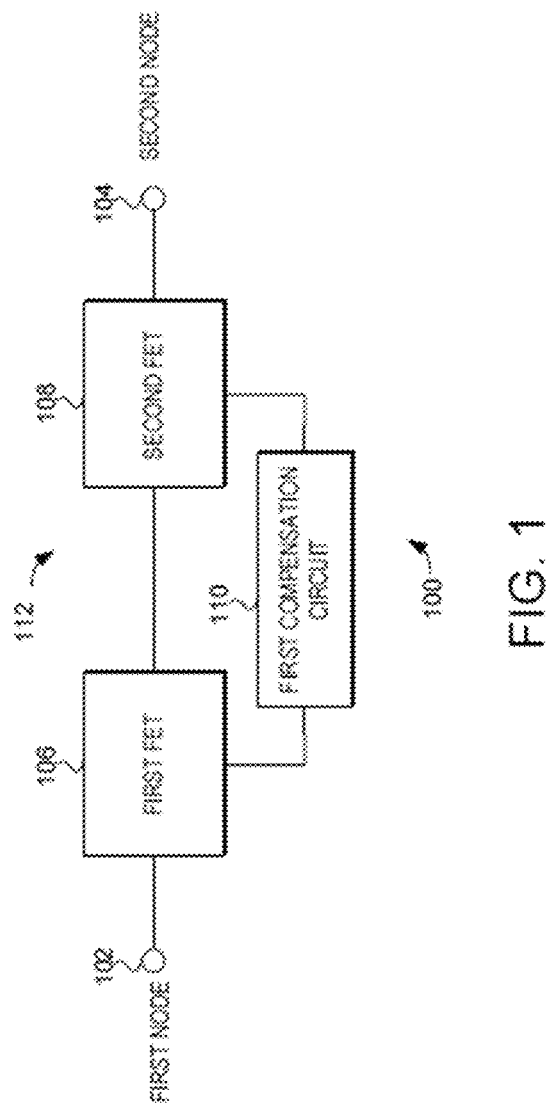
FIG. 1 is a schematic diagram of a field effect transistor (FET) stack in accordance with an exemplary embodiment.

The embodiments described herein include radio frequency (RF) switches that may provide increased power handling capability while also providing high switching speeds. In general, the embodiments described herein can provide this increased power handling by equalizing the voltages across transistors when the RF switch is open (i.e., in an inactive or non-current-conducting state). Specifically, the embodiments described herein can be implemented to equalize the source-drain voltages across each field effect transistor (FET) in a FET stack that occur when the RF switch is open and not conducting current. This equalization can be provided by using one or more compensation circuits to couple one or more gates and transistor bodies in the FET stack in a way that at least partially compensates for the effects of parasitic leakage currents in the FET stack that progressively decrease across the stack starting from the input-side FET. This compensation of the effects of parasitic leakage currents equalizes the source-drain voltages across each FET that are present when the RF switch is open, and can thus improve the power handling ability of the RF switch. Embodiments of the inventive subject matter include compensation circuits that modify the effective off-state FET impedances. In some embodiments, the compensation circuits progressively increase the effective off-state FET impedances starting with the input-side FET, thereby achieving a more uniform voltage division across the stack.

Furthermore, this compensation can be done in a way that maintains high speed switching capability in the RF switch. This high speed switching capability can be provided by using a switch topology that includes parallel FET stacks with altered FET dimensions to reduce the settling time required for an RF output to settle when the switch branches change their states of operation.

In one embodiment, the RF switch includes a first field-effect transistor stack coupled between a first node and a second node, where the first FET stack includes a first series-coupled plurality of field-effect transistors (FETs). Each FET includes source and drain regions separated by variably-conductive channel regions, gates overlying the channel regions and coupled to a gate terminal (or simply "gate"), a source terminal coupled to the source regions, a drain terminal coupled to the drain regions, and a transistor body. The electrical conductivity of a variable-conductivity channel between the source and drain terminals of any given FET is controlled by control signals provided to the FET's gate terminal.

The transistor body of a FET is that portion of the semiconductor substrate beneath the gate region and in between the source and drain regions of the FET. As such, a transistor body includes the portion of the semiconductor substrate in which a conducting channel is formed during operation of the FET when appropriate potentials are applied to the gate, drain and source terminals of the FET. In an embodiment the first series-coupled plurality of FETs includes at least a first FET, a second FET, and at least a first compensation circuit. The first compensation circuit is implemented to electrically couple a body of the first FET to a gate of the second FET. This electrical coupling of the body of one FET to the gate of another FET through the first compensation circuit provides an equalization of voltages across the first series-coupled plurality of FETs. Specifically, in one embodiment the first compensation circuit includes one or more impedances adapted to compensate for the effects of the parasitic leakage currents in a way that can equalize the source-drain voltages across each FET that are present when the RF switch is open. In a further embodiment, multiple FET stacks having the above-described arrangement are implemented in parallel in one or more switch branches to achieve relatively low settling times and high speed switching capability.

Turning now to FIG. 1, a schematic view of an RF switch 100 in accordance with an embodiment is illustrated. The RF switch 100 includes a first node 102, a second node 104, a first field-effect transistor (FET) 106, a second FET 108, and a first compensation circuit 110. The first FET 106 and the second FET 108 are a series-coupled plurality of FETs that form a first FET "stack" 112 that is coupled between the first node 102 and the second node 104.

As used herein, the terms "stack" and "FET stack" refer to multiple FETs that are coupled in series with each other (or "series-coupled") between two nodes of an RF switch. Each stack may be considered to be a "switch" or a "variably-conductive path", in that the conductivity of a signal through the stack (or more specifically through the series of channels of the FETs in the stack) can be controlled or varied (i.e., increased or decreased) based on control signals provided at the stack control terminals (e.g., terminals accepting "CONTROL" and "$\overline{\text{CONTROL}}$" signals, FIG. 6, and terminals 922, 925, 926, 931, 932, 935, FIG. 9). In other words, a stack (or switch or variably-conductive path) can be placed in a low-impedance (e.g., closed) state or a high-impedance (e.g., open) state based on control signals provided at the stack control terminal. Further, the terms "coupled in series" and "series-coupled," in reference to the electrical coupling between multiple FETs in a stack, means that the current-conducting terminals (e.g., source/drain terminals) of the multiple FETs are connected together to provide a continuous electrically conductive channel/path between a first node (e.g., node 102) and a second node (e.g., node 104) when the multiple FETs are in a conducting state (e.g., "on" or "closed"). Although the description herein refers to series-coupled arrangements in which a first FET has a drain terminal connected to a node, and has a source terminal connected to a drain terminal of a second FET, the source and drain terminal connections could be reversed, in other embodiments (e.g., a series-coupled arrangement may have a first FET with a source terminal connected to a node, and a drain terminal connected to a source terminal of a second FET). More generally, each of the source and drain terminals of a FET may be referred to as a "current-conducting terminal," and that term could be used interchangeably for either a source terminal or a drain terminal. Also, when two FETs are coupled in the above manner (i.e., the source of one FET in a stack is connected to the drain of another FET in the stack), these two FETs may be considered to be "adjacent" to each other.

The first FET 106 includes a first body and a first gate. Likewise, the second FET 108 includes a second body and a second gate. In accordance with the embodiments described herein, the first compensation circuit 110 is implemented to electrically couple the first body of the first FET 106 to the second gate of the second FET 108. This electrical coupling of the first body to the second gate through the first compensation circuit 110 facilitates an equalization of voltages across the first series-coupled plurality of FETs 112. Specifically, the first compensation circuit includes 110 is configured to compensate for the effects of the parasitic leakage currents in a way that can equalize the source-drain voltages across each of the first FET 106 and the second FET 108 that are present when the RF switch 100 is open.

In one embodiment, the first compensation circuit 110 includes one or more components characterized by one or more impedances (i.e., "impedance-providing components"). These one or more impedance-providing components are configured and implemented to compensate for the effects of the parasitic leakage currents in a way that can equalize the source-drain voltages across each of the FETs 106, 108 that are present when the RF switch 100 is open. In one embodiment, the one or more impedance-providing components can comprise a capacitor. In another embodiment, the one or more impedance-providing components can comprise a varactor. In another embodiment, the one or more impedance-providing components can comprise a resistor-capacitor (RC) series circuit. In another embodiment, the one or more impedance-providing components can comprise an active impedance-providing component, such as a metal oxide semiconductor FET (MOSFET) or metal oxide semiconductor capacitor (MOSCAP) implemented active impedance. In each of these embodiments the impedance-providing component(s) can be selected and implemented so that the impedances equalize the source-drain voltages across each of the FETs 106, 108 when the RF switch 100 is open. Detailed examples of such compensation circuits 110 will be described in greater detail with reference to FIGS. 4A, 4B, and 4C.

In some embodiments, the series-coupled plurality of FETs 112 can include additional FETs. As one example, the series-coupled plurality of FETs 112 can include a third FET that includes a third gate and a third body, and a fourth FET that includes a fourth gate and a fourth body. In such an embodiment a second compensation circuit can be provided, where the second compensation circuit electrically couples the third body and the fourth gate. One example of such an embodiment will be discussed in greater detail below with reference to FIG. 3A.

As another example, the series-coupled plurality of FETs 112 can include at least a third FET that includes a third gate and a third body. In such an embodiment a second compensation circuit can be provided, where the second compensation circuit electrically couples the second body and the third gate. Two examples of such an embodiment will be discussed in greater detail below with reference to FIGS. 3B and 3D.

As another example, the series-coupled plurality of FETs 112 can include at least a third FET that includes a third gate and a third body. In such an embodiment a compensation circuit can be provided, where the compensation circuit electrically couples the first body and the third gate. An example of such an embodiment will be discussed in greater detail below with reference to FIG. 3C.

In yet other embodiments the RF switch can include additional FET stacks coupled between additional nodes. And each of these additional FET stacks can include a series-coupled plurality of FETs with additional compensation circuits coupled between various gates and bodies in the additional FET stacks.

For example, in one embodiment the RF switch 100 can further comprise a second FET stack coupled between a third node and a fourth node. This second FET stack can include a second series-coupled plurality of FETs, wherein the second series-coupled plurality of FETs includes a third FET and a fourth FET. In this embodiment the third FET can include a third gate and a third body. Likewise, in this embodiment the fourth FET can include a fourth gate and a fourth body. And in this embodiment a second compensation circuit can be provided, where the second compensation circuit electrically couples the third body and the fourth gate. In this embodiment the second compensation circuit likewise includes impedances that can be selected and implemented to equalize the source-drain voltages across each of the third FET and the fourth FET. Examples of RF switches that include multiple FET stacks will be described in greater detail with reference to FIGS. 5-9.

The various FET stacks can be implemented with a variety of different types of FETs. For example, the FET stack 112 can be implemented with Silicon, Gallium Arsenide (GaAs) or Gallium Nitride (GaN) FETs, to give several nonlimiting examples.

Figure 2:
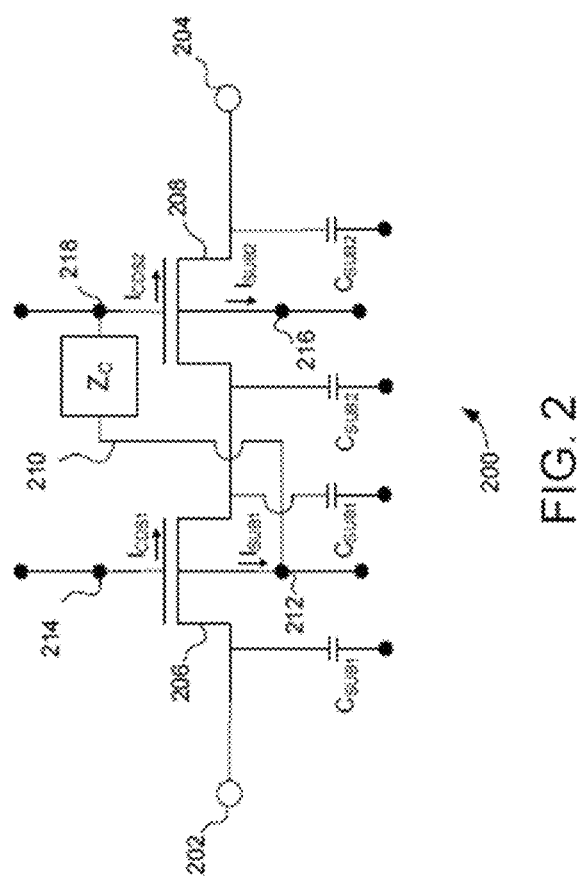
FIG. 2 is a circuit diagram of an FET stack in accordance with an exemplary embodiment.

Turning now to FIG. 2, a circuit diagram of a FET stack 200 in accordance with an embodiment is illustrated. The FET stack 200 is exemplary of the type of FET stack that can be implemented in an RF switch in accordance with the various embodiments described herein. The FET stack 200 includes a first FET 206, a second FET 208, and a first compensation circuit 210. The first FET 206 and the second FET 208 are a series-coupled plurality of FETs that form the FET stack 200. The FET stack 200 is coupled between a first node 202 and the second node 204. The first FET 206 includes a first body 212, a first gate 214, a first source terminal, and a first drain terminal. Likewise, the second FET 208 includes a second body 216, a second gate 218, a second source terminal, and a second drain terminal. The first source terminal of the first FET 206 is coupled to the first drain terminal of the second FET 208 to provide the FET stack 200.

During operation of the RF switch, the FETs 206, 208 are turned on when signals provided to the first and second gates 214, 218 cause the switch to be closed (i.e., in an active or current-conducting state), which allows current to conduct from first node 202 to second node 204 (and/or from the second node 204 to the first node 202). Conversely, the FETs 206, 208 are turned off when signals provided to the first and second gates 214, 218 cause the switch to be open, which prevents current from conducting from the first node 202 to the second node 204 (and/or from the second node 204 to the first node 202). However, even when the FETs 206, 208 are turned off there will be some source-drain leakage current ($I_{CDS}$) that flows between the source-drain terminals of each FET. Furthermore, there will be some body-substrate parasitic leakage current ($I_{SUB}$) that flows from the body of each FET to the underlying semiconductor substrate on which the FET is formed.

Specifically, each of the FETs 206, 208 includes a parasitic capacitance $C_{SUB}$ between the body of the FET and the underlying substrate. When the FETs 206, 208 are turned off, some body-substrate parasitic leakage current ($I_{SUB}$) still flows through the parasitic capacitance $C_{SUB}$ of each of the FETs 206, 208 to the substrate.

In the example of FIG. 2, a source-drain leakage current $I_{CDS1}$ flows through FET 206 and a source-drain leakage current $I_{CDS2}$ flows through FET 208. Likewise, a body-substrate parasitic leakage current $I_{SUB1}$ flows from FET 206 and a body-substrate parasitic leakage current $I_{SUB2}$ flows from FET 208.

The existence of the body-substrate parasitic leakage currents ($I_{SUB1}$, $I_{SUB2}$) necessarily causes the source-drain leakage currents ($I_{CDS1}$, $I_{CDS2}$) to be unequal, unless otherwise compensated for. Furthermore, the voltage across each of the FETs 206, 208 when the switch is open is determined in part by the source-drain leakage currents. For example, the drain-source voltage $V_{DS}$ across a FET when the FET is turned off to open the switch can be expressed as:

$$V_{DS} = I_{CDS} \frac{1}{j\omega C_{DS}}$$

where $C_{DS}$ is the drain-source capacitance of the FET. Thus, the unequal amount of source-drain leakage currents ($I_{CDS1}$, $I_{CDS2}$) caused by body-substrate parasitic leakage currents ($I_{SUB1}$, $I_{SUB2}$) will cause the drain-source voltages $V_{DS}$ of the FETs 206, 208 to be unequal, unless otherwise compensated for. These unequal voltages across the FETs 206, 208 will result in a higher source-drain voltage across one FET that can exceed its breakdown voltage, while the other FET with a lower source-drain voltage is still below its breakdown voltage. These unequal voltages across the FETs 206, 208 can thus reduce the voltage handling capacity of the overall FET stack 200, unless otherwise compensated for.

In accordance with the embodiments described herein, a first compensation circuit 210 is implemented to electrically couple the first body 212 of the first FET 206 to the second gate 218 of the second FET 208. This electrical coupling of the first body 212 to the second gate 218 through the first compensation circuit 210 facilitates an equalization of voltages across the FET stack 200 that can improve the voltage handling capacity of the FET stack 200. Specifically, the first compensation circuit 210 is configured to compensate for the effects of the body-source parasitic leakage currents ($I_{SUB1}$, $I_{SUB2}$) in a way that can equalize the drain-source voltages ($V_{DS}$) across each of the first FET 206 and the second FET 208. To facilitate this, the first compensation circuit 210 includes one or more components characterized by an impedance $Z_C$. The impedance $Z_C$ is configured and implemented to compensate for the effects of the body-source parasitic leakage currents ($I_{SUB1}$, $I_{SUB2}$) in a way that can equalize the drain-source voltages across each of the FETs 206, 208 when the FETs are turned off to provide an open circuit between the first node 202 and the second node 204. As described above, in various embodiments, the impedance $Z_C$ can comprise a capacitor, varactor, resistor-capacitor (RC) series circuit, active impedance, etc. These various embodiments of impedance $Z_C$ will be discussed in greater detail below.

As described above, in some embodiments, the FET stacks can include additional FETs and additional compensation circuits. Turning now to FIG. 3A, a circuit diagram of a FET stack 300 in accordance with another embodiment is illustrated. The FET stack 300 is exemplary of the type of FET stack that can be implemented in an RF switch in accordance with the various embodiments described herein. The FET stack 300 includes a first FET 306, a second FET 308, a third FET 307, a fourth FET 309, a first compensation circuit 310, and a second compensation circuit 311. The first FET 306, second FET 308, third FET 307, and fourth FET 309 are a series-coupled plurality of FETs that form the FET stack 300. As used herein, "series-coupled", in references to multiple FETs, means that the source terminal of a first FET is connected to the drain terminal of a second FET, the source terminal of the second FET is connected to the drain terminal of a third FET, and so on. The FET stack 300 is coupled between a first node 302 and a second node 304. The first FET 306 includes a first body 312, a first gate 314, a first source terminal, and a first drain terminal. Likewise, the second FET 308 includes a second body 316, a second gate 318, a second drain terminal (coupled to the first source terminal), and a second source terminal. Likewise, the third FET 307 includes a third body 313, a third gate 315, a third drain terminal (coupled to the second source terminal), and a third source terminal. Finally, the fourth FET 309 includes a fourth body 317, a fourth gate 319, a fourth drain terminal (coupled to the third source terminal), and a fourth source terminal.

During operation of the RF switch, the FETs 306, 308, 307, 309 are turned on when signals provided to the gates 314, 318, 315, 319 cause the switch to be closed, which allows current to conduct from first node 302 to second node 304 (and/or from the second node 304 to the first node 302). Conversely, the FETs 306, 308, 307, 309 are turned off when signals provided to the gates 314, 318, 315, 319 cause the switch to be open, which prevents current from conducting from the first node 302 to the second node 304 (and/or from the second node 304 to the first node 302).

However, as was described above, even when the FETs 306, 308, 307, 309 are turned off there will be some source-drain leakage current ($I_{CDS}$) that flows between the source-drain terminals of each FET. Furthermore, there will be some body-substrate parasitic leakage current ($I_{SUB}$) that flows from the body of each FET to the underlying substrate. The existence of the body-substrate parasitic leakage currents necessarily causes the source-drain leakage currents to be unequal, unless otherwise compensated for, which in turn can cause the voltage across each of the FETs 306, 308, 307, 309 to be unequal. These unequal voltages across the FETs 306, 308, 307, 309 can result in a higher source-drain voltage across one FET that can exceed its breakdown voltage and thus reduce the voltage handling capacity of the overall FET stack 300.

In accordance with the embodiments described herein, the first compensation circuit 310 is implemented to electrically couple the first body 312 of the first FET 306 to the second gate 318 of the second FET 308. Likewise, the second compensation circuit 311 is implemented to electrically couple the third body 313 of the third FET 307 to the fourth gate 319 of the fourth FET 309. These electrical couplings facilitate an equalization of voltages across the FET stack 300 that can improve the voltage handling capacity of the FET stack 300. Specifically, the first compensation circuit 310 and the second compensation circuit 311 are configured to compensate for the effects of the body-source parasitic leakage currents in a way that can equalize the drain-source voltages across each of the FETs 306, 308, 307, 309. To facilitate this, the first compensation circuit 310 includes an impedance $Z_{C1}$ and the second compensation circuit 311 includes an impedance $Z_{C2}$. These impedances $Z_{C1}$ and $Z_{C2}$ are configured and implemented to compensate for the effects of the body-source parasitic leakage currents ($I_{SUB1}$, $I_{SUB2}$) in a way that can equalize the drain-source voltages across each of the FETs 306, 308, 307, 309 that are present when the FETs are turned off to provide an open circuit between the first node 302 and the second node 304. As described above, in various embodiments, the impedances $Z_{C1}$ and $Z_{C2}$ can comprise a capacitor, varactor, resistor-capacitor (RC) series circuit, active impedance, etc. These various embodiments of impedance $Z_{C1}$ and $Z_{C2}$ will be discussed in greater detail down below.

It should be noted that in the FET stack 300 there is not a compensation circuit between all FETs in the FET stack 300. However, in other embodiments additional compensation circuits can be provided. Turning now to FIG. 3B, a circuit diagram of a FET stack 320 in accordance with another embodiment is illustrated. The FET stack 320 includes a first FET 306, a second FET 308, a third FET 307, a fourth FET 309, a first compensation circuit 310, a second compensation circuit 311, and a third compensation circuit 321.

In accordance with the embodiments described herein, the first compensation circuit 310 is implemented to electrically couple the first body 312 of the first FET 306 to the second gate 318 of the second FET 308. Likewise, the second compensation circuit 311 is implemented to electrically couple the third body 313 of the third FET 307 to the fourth gate 319 of the fourth FET 309. Likewise, the third compensation circuit 321 is implemented to electrically couple the second body 316 of the second FET 308 to the third gate 315 of the third FET 307.

Again, these electrical couplings facilitate an equalization of voltages across the FET stack 320 that can improve the voltage handling capacity of the FET stack 320. Specifically, the compensation circuits 310, 311 and 321 are configured to compensate for the effects of the body-source parasitic leakage currents in a way that can equalize the drain-source voltages across each of the FETs 306, 308, 307, 309. To facilitate this, the compensation circuits 310, 311 and 321 include impedances $Z_{C1}$, $Z_{C2}$, $Z_{C3}$ that are implemented to compensate for the effects of the body-source parasitic leakage currents. Again, various embodiments of impedance $Z_{C1}$, $Z_{C2}$ and $Z_{C3}$ will be discussed in greater detail down below.

It is next to be noted that the compensation circuits can be configured to connect the body and gates of non-adjacent FETs in the FET stack. In these embodiments the compensation circuit can skip over one or more intermediate FETs in the series-coupled FET stack to connect the body and gate of non-adjacent FETs in the stack. Turning now to FIG. 3C, a circuit diagram of a FET stack 320 in accordance with another embodiment is illustrated. The FET stack 320 includes a first FET 306, a second FET 308, a third FET 307, a fourth FET 309 and a first compensation circuit 332. Notably, in this embodiment the first compensation circuit 332 connects the body and gate of non-adjacent first and third FETs 306, 307 in the FET stack 330 and thus the first compensation circuit 332 effectively skips over the second FET 308. In the illustrated embodiment, the first compensation circuit 332 skips over only one intermediate FET (i.e., FET 308). In other embodiments, a compensation circuit may skip over multiple (e.g., two or more) intermediate FETs in a stack. And again, the first compensation circuit 332 includes an impedance $Z_C$ implemented to compensate for the effects of the body-source parasitic leakage currents.

It is further noted that the compensation circuits can be configured to connect the body and gates of those FETs in the FET stack that are on the "input side" of the FET stack (i.e., the node 302 at which an input signal is provided to the FET stack), while not providing compensation circuits for FETs that are further toward the "output side" of the FET stack (i.e., the node 304 at which an output signal is provided by the FET stack). Turning now to FIG. 3D, a circuit diagram of a FET stack 340 in accordance with another embodiment is illustrated. The FET stack 340 includes a first FET 306, a second FET 308, a third FET 307, a fourth FET 309, a first compensation circuit 310, and second compensation circuit 334.

In accordance with the embodiments described herein, the multiple compensation circuits 310, 334 are configured to progressively increase the effective off-state FET impedances of the FETs 306, 308, 307, 309 across the stack, starting with the first input-side FET 306, thereby achieving a more uniform voltage division across the stack. In effect, the compensation circuits lower the body node impedance, thereby steering more leakage current towards the lower FETs in the stack (i.e., FETs toward the output side of the stack). In the embodiment illustrated in FIG. 3D, the first compensation circuit 310 is implemented to electrically couple the first body 312 of the first FET 306 to the second gate 318 of the second FET 308. Likewise, the second compensation circuit 334 is implemented to electrically couple the second body 316 of the second FET 308 to the third gate 315 of the third FET 307. It should be noted that no compensation circuit is implemented between the third FET 307 and the fourth FET 309. Accordingly, compensation circuits 310, 334 are implemented to electrically coupled adjacent FETs 306, 308, 307 at the "input side" of the FET stack 340, but the FET stack 340 does not include compensation circuits that electrically coupled FETs 307, 309 on the "output side" of the FET stack 340. And again, each compensation circuit 310, 334 includes an impedance $Z_C$ implemented to compensate for the effects of the body-source parasitic leakage currents.

It is also noted at this point that a FET stack may include more or fewer FETs than is illustrated in FIGS. 3A, 3B, 3C, and 3D. For example, an alternate embodiment of a FET stack may include anywhere from two series-coupled FETs to thirty or more series-coupled FETs, and the various embodiments illustrated in FIGS. 3A, 3B, 3C, and 3D may be implemented in FET stacks that include more or fewer FETs than are illustrated in these figures. For example, referring to FIG. 3D, an alternate embodiment of a FET stack may include N series-coupled FETs, where N may be any integer between four and thirty (or more). In such an embodiment, the number of compensation circuits implemented at the input side of the FET stack may be as few as one compensation circuit (i.e., coupling only the first and second input-side pair of adjacent FETs), as many as N−2 (i.e., coupling all but the last, output-side pair of adjacent FETs), or any number in between (e.g., half of the adjacent FET pairs at the input side of the stack may be coupled together with compensation circuits, while the other half of the adjacent FET pairs at the output side of the stack may lack such compensation circuits).

As described above, the various compensation circuits (e.g., compensation circuits 110, 210, 310, 311, 321, 332) are each implemented with an impedance configured to at least partially compensate for the effects of the body-source parasitic leakage currents and equalize the drain-source voltages across the FETs in the FET stack when those FETs are turned off to provide an open circuit. And as described above, in various embodiments the impedances can comprise a capacitor, varactor, RC series circuit, active impedance, etc.

Figure 4A:
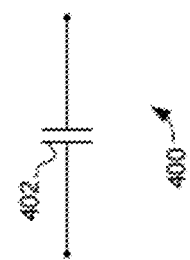
FIGS. 4A, 4B, and 4C are circuit diagrams of compensation circuits in accordance with exemplary embodiments.

Turning now to FIG. 4A, a circuit diagram of an exemplary compensation circuit 400 (e.g., an instance of circuit 110, 210, 310, 311, 321, 332. 334) in accordance with a first embodiment is illustrated. In this embodiment, the compensation circuit 400 includes an impedance provided with a capacitor 402 (i.e., capacitor 402 is an impedance-providing component) that includes a first terminal and a second terminal. Such a capacitor 402 can implemented with any suitable type of capacitor, including discrete devices and integrated passive devices (IPDs) such as metal-insulator-metal (MIM) capacitors. In other embodiments, the capacitor 402 can be implemented with a capacitive assembly (e.g., a low-temperature co-fired ceramic (LTCC) assembly). In yet other embodiments the capacitor 402 can be implemented as an active impedance capacitor, such as a metal oxide semiconductor capacitor (MOSCAP) or other such device.

In each of these embodiments the capacitor 402 can be implemented to compensate for the effects of the body-source parasitic leakage currents by connecting the first terminal of the capacitor 402 to the body of a first FET in a stack (e.g., a FET closer to an input side of the stack), and connecting the second terminal of the capacitor 402 to the gate of a second FET (e.g., a FET closer to the output side of the stack). In such embodiments the capacitive value of the capacitor 402 needed to provide the desired compensation can be determined using computer simulations. For example, the capacitor 402 value is can be determined by computer simulations implemented to select values that result in a uniform voltage distribution across each of the FETs. Specifically, these computer simulations can be repeatedly performed using different combinations of capacitors with different capacitive values in the various compensation circuits of the FET stack until the desired voltage uniformity across the FET stack is obtained. In one exemplary embodiment the capacitor 402 has a capacitance between 20 femtofarads and 5 picofarads, although the capacitance value may be lower or higher, as well.

Figure 4B:

Turning now to FIG. 4B, a circuit diagram of an exemplary compensation circuit 410 (e.g., an instance of circuit 210, 310, 311, 321, 332) in accordance with a second embodiment is illustrated. In this embodiment, the compensation circuit 410 includes impedances provided in an RC series circuit that includes a capacitor 412 and a resistor 414 (i.e., capacitor 412 and resistor 414 are impedance-providing components) coupled in series between a first terminal and a second terminal. Again, such a capacitor 412 and resistor 414 can be implemented with any suitable type of capacitor and resistor, including a variety of integrated passive devices.

In each of these embodiments the RC series circuit 410 can be implemented to compensate for the effects of the body-source parasitic leakage currents by connecting the first terminal of the RC series circuit 410 to the body of a first FET in a stack (e.g., a FET closer to an input side of the stack), and connecting the second terminal of the RC series circuit 410 to the gate of a second FET I the stack (e.g., a FET closer to the output side of the stack). And again, in such embodiments the capacitive value of the capacitor 412 and the resistive value of the resistor 414 can be determined using computer simulations. Specifically, these computer simulations can again be repeatedly performed using different combinations of capacitors and resistors with different component values in the various compensation circuits of the FET stack until the desired voltage uniformity across the FET stack is obtained. In one exemplary embodiment the capacitor 412 has a capacitance between 20 femtofarads and 5 picofarads, and the resistor 414 has a resistance between 5 kiloohms and 100 kiloohms, although the capacitance and/or resistance values may be lower or higher, as well.

Figure 4C:
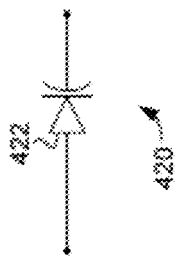

Turning now to FIG. 4C, a circuit diagram of an exemplary compensation circuit 420 (e.g., an instance of circuit 210, 310, 311, 321, 332) in accordance with a third embodiment is illustrated. In this embodiment, the compensation circuit 420 includes an impedance provided with a varactor 422 (i.e., varactor 422 is an impedance-providing component) that includes a first terminal and a second terminal. In general, a varactor is a variable capacitance diode that can be implemented to provide a selectable capacitance. In some embodiments the varactor 422 can be implemented to be adjustable using a third node or input. This ability of adjust the capacitance can be used for operational tuning of the RF switch. The varactor 422 can implemented with any suitable type of varactor. In each of these embodiments the varactor 422 can be implemented to compensate for the effects of the body-source parasitic leakage currents by connecting the first terminal of the varactor 422 to the body of a first FET in a stack (e.g., a FET closer to an input side of the stack), and connecting the second terminal of the varactor 422 to the gate of a second FET in the stack (e.g., a FET closer to the output side of the stack).

Figure 5:
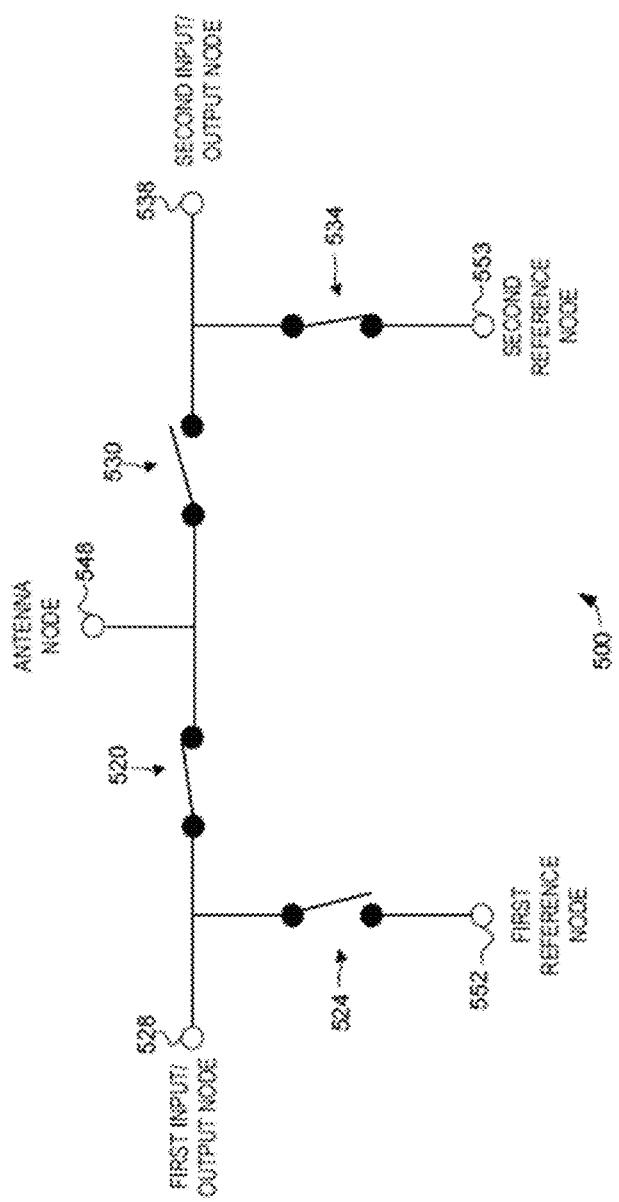
FIG. 5 is a simplified schematic of an RF switch in accordance with an exemplary embodiment.

Turning to FIG. 5, a simplified circuit diagram of an RF switch 500 in accordance with an exemplary embodiment is illustrated. For example, RF switch 500 may provide the functionality of RF switch 1210 (FIG. 12) and/or RF switch 1310 (FIG. 13), described later. The RF switch 500 includes a plurality of input/output (I/O) nodes, including first I/O node 528, a second I/O node 538, and a third I/O node 548. The RF switch 500 further includes a first reference node 552 and a second reference node 553. RF switch 500 further includes a plurality of switches 520, 524, 530, 534 (also referred to herein as "branches") electrically coupled between the various nodes 528, 538, 548, 552, 553. As was described above, one or more of the switches 520, 524, 530, 534 may be implemented as a stack of FETs. As used herein, a switch "branch" includes the switching circuitry connected between any two nodes of an RF switch. Accordingly, RF switch 500 is shown to include four branches, where a first branch 520 ("TX series branch") includes switch circuitry between nodes 528 and 548, a second branch 524 ("TX shunt branch") includes switch circuitry between nodes 528 and 552, a third branch 530 ("RX series branch") includes switch circuitry between nodes 538 and 548, and a fourth branch 534 ("RX shunt branch") includes switch circuitry between nodes 538 and 553.

In accordance with the embodiments described herein, one or more the FET stacks used to implement the switches 520, 524, 530, 534 can include compensation circuits (e.g., compensation circuits 110, 210, 310, 311, 321, 332, 334, 400, 410, 420) configured between one or more FET bodies and gates. And as described above these compensation circuits are implemented to electrically couple the bodies and gates in a way compensates for the effects of the body-source parasitic leakage currents and equalize the drain-source voltages across the FETs in one or more of the switches 520, 524, 530, 534. It should be noted that, in some embodiments, each of the switches 520, 524, 530, 534 may include one or more compensation circuits, while in other embodiments, some of the switches 520, 524, 530, 534 may include one or more compensation circuits, while other ones of the switches 520, 524, 530, 534 may not include compensation circuits.

Figure 6:
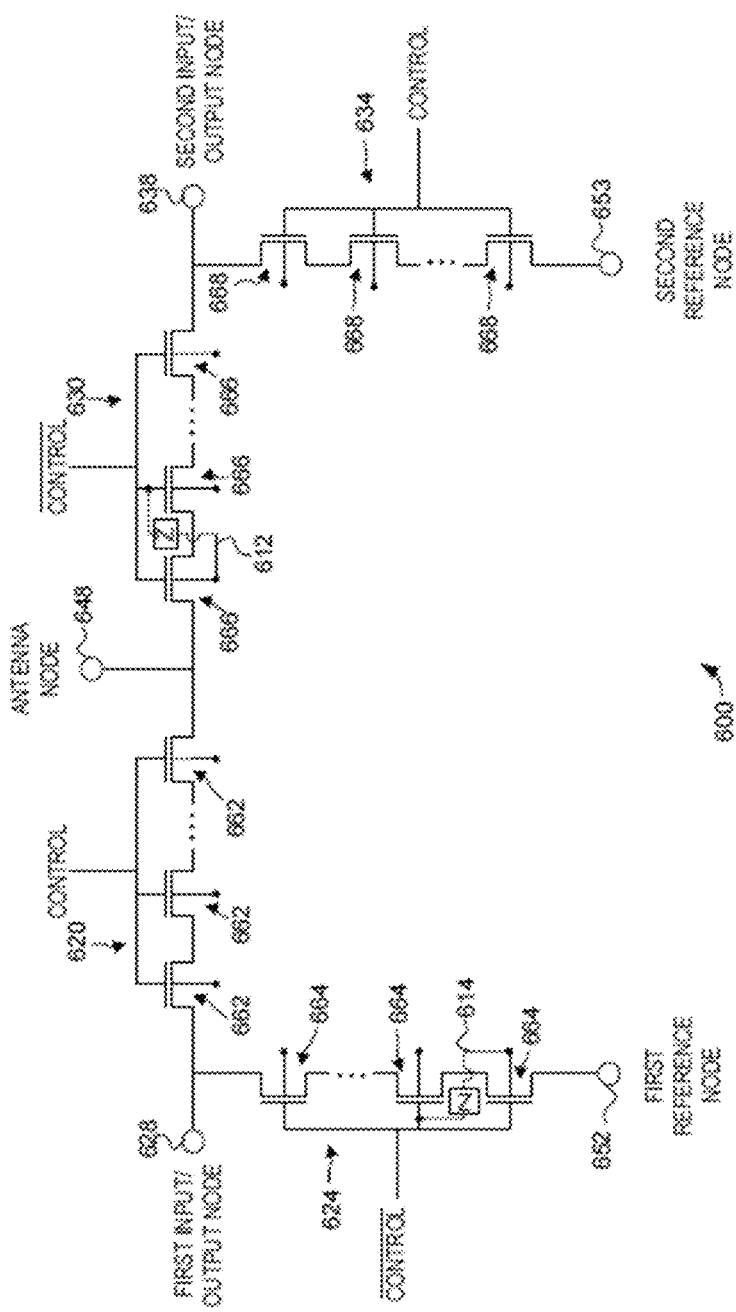
FIG. 6 is a circuit diagram of an RF switch in accordance with an exemplary embodiment.

Turning to FIG. 6, a more detailed circuit diagram of an RF switch 600 in accordance with an exemplary embodiment is illustrated. In this illustrated example, the RF switch 600 again includes a plurality of input/output nodes, including first I/O node 628 (e.g., a transmit node), a second I/O node 638 (e.g., a receive node), and a third I/O node 648 (e.g., an antenna or circulator node). The RF switch 600 further includes a first reference node 652 and a second reference node 653. The RF switch 600 further includes a plurality of switches 620, 624, 630, 634 electrically coupled between the various nodes 628, 638, 648, 652, 653. In this illustrated embodiment each of the switches 620, 624, 630, 634 are implemented as a stack of FETs.

Specifically, switch 630 is implemented as a first stack of series-coupled FETs 666 that are electrically coupled between the I/O node 648 and the I/O node 638. Likewise, switch 620 is implemented as a second stack of series-coupled FETs 662 that are electrically coupled between the I/O node 628 and I/O node 648. Switch 624 is likewise implemented as a third stack of series-coupled FETs 664 that are electrically coupled between the I/O node 628 and first reference node 652. Finally, switch 634 is likewise implemented as a fourth stack of series-coupled FETs 668 that are electrically coupled between the I/O node 638 and second reference node 653. It should be noted that while the first reference node 652 and the second reference node 653 would typically be coupled to a ground reference (e.g., zero volts), the nodes could alternatively be coupled to a positive or negative DC voltage reference.

As used herein, the term "series-coupled," in reference to the electrical coupling between multiple FETs in a stack, means that the output terminals (e.g., source/drain terminals) of the multiple FETs are connected together to provide a continuous electrically conductive channel/path between an input node (e.g., I/O node 628) and an output node (e.g., I/O node 648) when the multiple FETs are in a conducting state (e.g., "on" or "closed"). For example, in a series-coupled sequence of FETs a source terminal for one FET may be coupled to the drain terminal of the adjacent FET.

In FIG. 6, each of the switches 620, 624, 630, 634 of FETs is shown to include three series-coupled FETs 662, 664, 666, 668. However, this is just one example implementation. In other embodiments each of the switches 620, 624, 630, 634 may alternatively include less than three FETs or more than three FETs (as indicated with the ellipses in each FET stack). Furthermore, each of the switches 620, 624, 630, 634 may include a same number of FETs or may instead include different numbers of FETs.

In this illustrated example each of the FETs 662, 664, 666, 668 includes a gate terminal (or control terminal), an input terminal (e.g., a drain/source terminal), an output terminal (e.g., a source/drain terminal), and a body terminal. As typical with FETs, the conductivity of the channel between source/drain terminals for each of the FETs 662, 664, 666, 668 may be controlled by the application of appropriate voltages to the corresponding gate terminal.

To facilitate operation, the RF switch 600 is controlled using a control signal (CONTROL) and an inverse control signal ($\overline{\text{CONTROL}}$). Specifically, the control signal is used to control switches 620 and 634 and the inverse control signal is used to control switches 624 and 630. To facilitate this, the control signal is applied to the gate terminals of the FETs 662 and 668, and the inverse control signal is applied to the gate terminals of FETs 664 and 666. Typically, the control signals and inverse control signals provided to each gate in any particular switch 620, 624, 660, 634 are synchronous, in that they simultaneously cause all of the FETs in that stack either to be substantially conducting (e.g., "on" or "closed") or substantially non-conducting (e.g., "off" or "open"). However, it should be noted that in other embodiments the control signals and inverse control signals may be asynchronous. As will be explained in more detail later in conjunction with FIG. 9, to achieve simultaneous control of all FETs in any particular switch, the gate terminals of the FETs in the switch may be electrically coupled to a single control terminal (e.g., control terminals 922, 925, 926, 931, 932, 935, FIG. 9).

Figure 12:
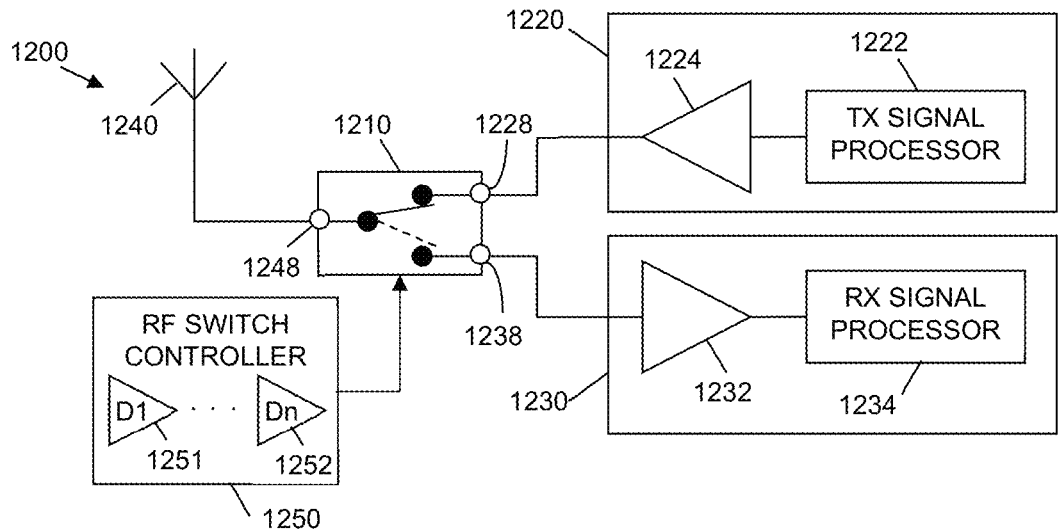
FIG. 12 is a simplified block diagram of an example of an RF transceiver system.

As illustrated in FIG. 12, which is discussed later, RF switch may be implemented in a system that includes a transmitter (e.g., transmitter 1220, FIG. 12), a receiver (e.g., receiver 1230, FIG. 12), and an antenna (e.g., antenna 1240, FIG. 12). In such a system, during typical operation the RF switch 600 (e.g., switch 1210, FIG. 12) is operated to alternate between: 1) a transmit mode in which I/O node 628 (e.g., I/O node 1228, FIG. 12) is coupled to the I/O node 648 (e.g., I/O node 1248, FIG. 12) to convey an RF signal received from the transmitter to the antenna; and 2) a receive mode in which I/O node 648 (e.g., I/O node 1248, FIG. 12) is coupled to I/O node 638 (e.g., I/O node 1238, FIG. 12) to convey an RF signal from the antenna to the receiver.

Figure 13:
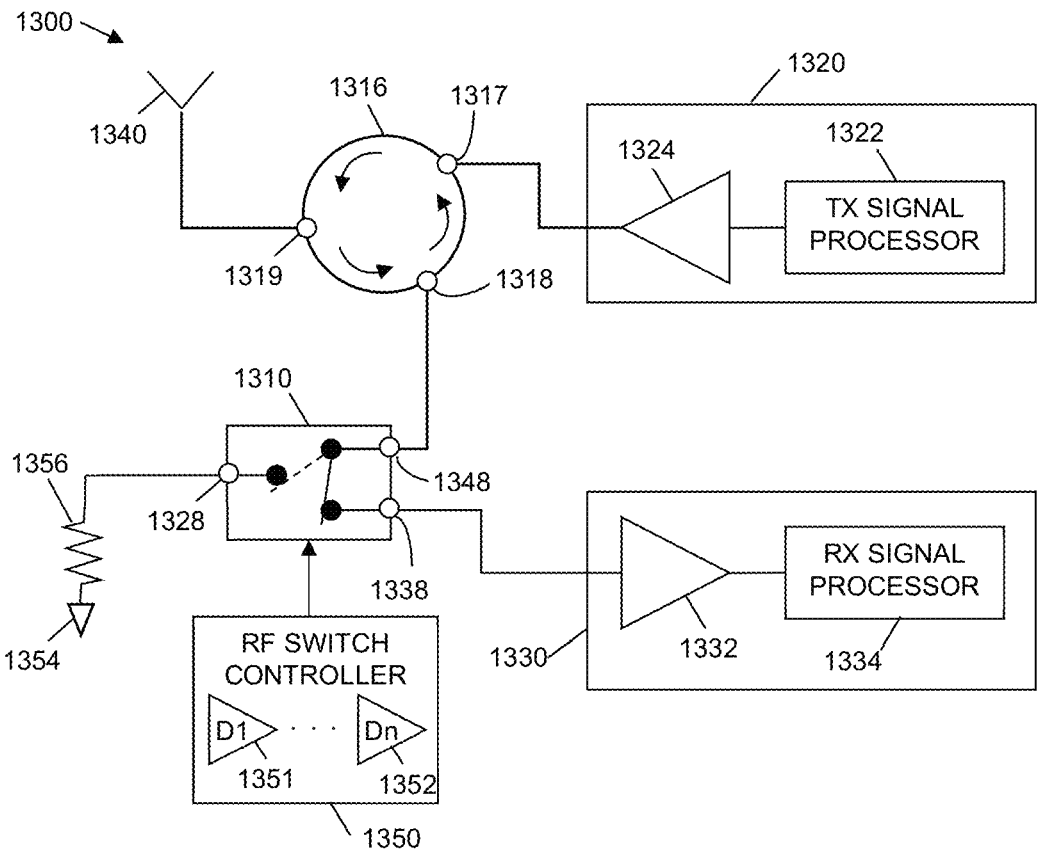
FIG. 13 is a simplified block diagram of another example of an RF transceiver system.

Alternatively, as illustrated in FIG. 13, which is discussed later, when RF switch 600 is implemented in a system that includes a circulator (e.g., circulator 1316, FIG. 13), I/O node 648 (e.g., I/O node 1348, FIG. 13) may be coupled to the circulator, I/O node 638 (e.g., I/O node 1338, FIG. 13) may be coupled to a receiver (e.g., receiver 1330, FIG. 13), and I/O node 628 (e.g., I/O node 1328, FIG. 13) may be coupled to a termination (e.g., termination 1356, FIG. 13). During typical operation the RF switch 600 (e.g., switch 1310, FIG. 13) is operated to alternate between: 1) a receive mode in which I/O node 648 (e.g., circulator node 1348, FIG. 13) is coupled to I/O node 638 (e.g., I/O node 1338, FIG. 13) to convey an RF signal received from the antenna/circulator to the receiver; and 2) a transmit mode in which I/O node 648 (e.g., circulator node 1348, FIG. 13) is coupled to I/O node 638 (e.g., termination node 1328, FIG. 13) to convey any transmit signal energy that did not appropriately exit the antenna port of the circulator to ground (rather than to the receiver).

In either embodiment, in the transmit state, switches 620 and 634 are closed, and switches 624 and 630 are open. In the transmit state the control signal applied to the gate terminals of FETs 662 and 668 causes those FETs to be in a substantially conducting state, while the inverse control signal applied to the gate terminals of FETs 664 and 666 causes those FETs to be in a substantially non-conducting state. Accordingly, in the transmit state, signal energy present at I/O node 628 is conveyed through switches 620 to I/O node 648, and the conductive path between I/O node 628 and reference node 652 is open. In addition, in the transmit state, signal energy present at I/O node 638 is conveyed through switches 634 to reference node 653, and the conductive path between I/O node 638 and I/O node 648 is open.

Conversely, in the receive state, switches 630 and 624 are closed, and switches 620 and 634 are open. Specifically, in the receive state the inverse control signal applied to the gate terminals of FETs 664 and 666 causes those FETs to be in a substantially conducting state, while the control signal applied to the gate terminals of FETs 662 and 668 causes those FETs to be in a substantially non-conducting state. Accordingly, in the receive state, signal energy present at I/O node 648 is conveyed through switches 630 to I/O node 638, and the conductive path between I/O node 638 and ground reference node 653 is open. In addition, in the receive state, signal energy present at I/O node 628 is conveyed through switches 624 to ground reference node 652, and the conductive path between I/O node 628 and the I/O node 648 is open.

The RF switch 600 can be implemented in variety of devices and structures. For example, in one embodiment the RF switch 600 is monolithic with FETs 662, 664, 666, and 668 formed in and on a single integrated circuit substrate (e.g., on a single semiconductor die). For example, according to one embodiment the RF switch IC 600 may be formed on a silicon-on-insulator (SOI) substrate. In other embodiments the RF switch IC 600 may be formed on a gallium arsenide (GaAs)-based substrate. In other embodiments other substrates may be used including other silicon (Si)-based substrates (e.g., bulk Si) and gallium nitride (GaN)-based substrates (e.g., GaN on silicon, GaN on silicon carbide (SiC), and so on).

To implement switches 620, 624, 630, and 634, a variety of different types of FETs can be used. For example, some or all of the FETs 662, 664, 666, and 668 may be implemented with multiple-gate FETs, although some or all of the FETs may be single-gate FETs, as well. Essentially, a single-gate FET is a monolithic transistor device that includes a variable-conductivity channel between drain and source terminals, along with only one gate positioned over the channel. Conversely, a multiple-gate FET is a monolithic transistor device that includes a variable-conductivity channel between drain and source terminals, along with multiple gates positioned over the channel. Electrical signals provided to the multiple gates control the conductivity of the channel during operation of the FET. In some applications, utilization of multiple gates may enable better electrical control over the channel, when compared with single-gate FETs. This, in turn, may enable more effective suppression of "off-state" leakage current, and/or enhanced current in the "on" state (i.e., drive current).

Furthermore, in one embodiment the one or more of the FETs 662, 664, 666, and 668 may be implemented with pseudomorphic high electron mobility transistors (pHEMTs). In other embodiments one or more of the FETs 662, 664, 666, and 668 may be implemented in a variety of differently configured, gate-controlled, three-terminal components or transistors, including differently-configured pHEMTs, metal oxide semiconductor FETs (MOSFETs), high electron mobility transistors (HEMTs), metal-semiconductor field effect transistors (MESFETs), laterally diffused metal-oxide semiconductor (LDMOS) FETs, Enhancement-mode MOSFETs (EMOSFETs), and junction gate FETs (JFETs), to name a few.

In accordance with the embodiments described herein the RF switch 600 includes at least a first compensation circuit 612 and a second compensation circuit 614. The first compensation circuit 612 couples a body of a first FET 666 to a gate of a second FET 666 in FET stack 630. Likewise, the second compensation circuit 614 couples a body of a first FET 664 to a gate of a second FET 664 in FET stack 624. Again, these compensation circuits 612 and 614 include impedances $Z_C$ configured to compensate for the effects of the body-source parasitic leakage currents and equalize the drain-source voltages across the FETs 666 and 664.

In another embodiment the RF switch 600 includes a first plurality of compensation circuits 612 in FET stack 630, each of the first plurality of compensation circuits 612 coupling a gate on one FET 666 in the first series-coupled plurality of FETs 666 to a body on another one of the first series-coupled plurality of FETs 666. Any of the FET stacks 300, 320, 330, 340 with their associated compensation circuits depicted in FIGS. 3A, 3B, 3C, and 3D may be implemented in FET stack 630, along with any alternate embodiments of such FET stacks 300, 320, 330, 340 discussed above. The RF switch 600 can also include a second plurality of compensation circuits 614 in FET stack 624, each of the second plurality of compensation circuits 614 coupling a gate on one FET 664 in the second series-coupled plurality of FETs 664 to a body on another one of the second series-coupled plurality of FETs 664. Again, any of the FET stacks 300, 320, 330, 340 with their associated compensation circuits depicted in FIGS. 3A, 3B, 3C, and 3D may be implemented in FET stack 624, along with any alternate embodiments of such FET stacks 300, 320, 330, 340 discussed above. Further, although FET stacks 620, and 634 are depicted without compensation circuits in FIG. 6, in other embodiments, either or both of FET stacks 620, 634 may include any of the FET stacks 300, 320, 330, 340 with their associated compensation circuits depicted in FIGS. 3A, 3B, 3C, and 3D, along with the alternate embodiments of such FET stacks 300, 320, 330, 340 discussed above.

Although not shown in FIG. 6, but as will be described in detail in conjunction with FIG. 9, in addition to the FETs and compensation circuits, each stack may include a DC bias distribution network of high-value (e.g., multiple kiloohm) resistors (e.g., resistors 991-993, FIG. 9), in an embodiment, where each resistor is coupled between the source and drain terminals of a FET. The DC bias distribution network essentially ensures that the DC bias voltage provided to the drains/sources of each FET in the stack is the same. In addition, each stack also may include an RF blocking network of high-value (e.g., multiple kiloohm) resistors (e.g., resistors 994-996, FIG. 9) coupled between the gate terminals of the FETs and the stack control terminal (e.g., stack control terminal 922, FIG. 9) for the stack, in an embodiment. The RF blocking network presents a high impedance to RF signal energy to ensure that the RF signal energy conveyed through a branch does not leak to the control/driver circuitry (e.g., to controller 1250, 1350, FIGS. 12, 13). Further still, each stack also may include body bias circuitry coupled between the body node of each FET, if included, and a body bias terminal (e.g., body bias terminal 990, FIG. 9). The body bias circuitry also may include an RF blocking network of high-value (e.g., multiple kiloohm) resistors (e.g., resistors 997-999, FIG. 9) coupled between the body nodes of the FETs and the body bias terminal for the stack, in an embodiment. Again, the RF blocking network presents a high impedance to RF signal energy to ensure that the RF signal energy conveyed through a branch does not leak to the body bias circuitry (not illustrated).

In the above-described embodiments, each of RF switches 500, 600 implement a single FET stack in the switching branch coupled between any particular set of nodes. In various other embodiments, an RF switch includes at least one branch with multiple FET stacks arranged in parallel between switch ports (e.g., between the transmit and antenna ports, between the antenna and receive ports, and/or between a ground reference and the transmit port and/or receive port). During operation, an RF signal conveyed through a branch with parallel FET stacks is divided, and thus of relatively low power in each stack. Accordingly, given the same signal power conveyed through a branch, the FETs in the parallel FET stacks may be smaller in periphery, when compared with conventional RF switches that include only a single FET stack in a branch between switch ports. Further, because the relatively small FETs have lower gate capacitance, when compared with their larger counterparts, the time constants of the relatively small FETs also are smaller than the time constants of their larger counterparts. Accordingly, the settling time associated with switching between transmit and receive states may be relatively fast using implementations of the various embodiments, when compared with the settling times for conventional RF switches. This may enable systems to support faster and faster transmit/receive mode switching speeds, and thus higher data throughput. Any one or more of these FET stacks also may include one or compensation circuits (e.g., compensation circuits 110, 210, 310, 311, 321, 332, 334, 400, 410, 420, FIGS. 1, 2, 3A-D, 4A-C), and a particular example is shown in detail in FIG. 9, described later.

Figure 7:
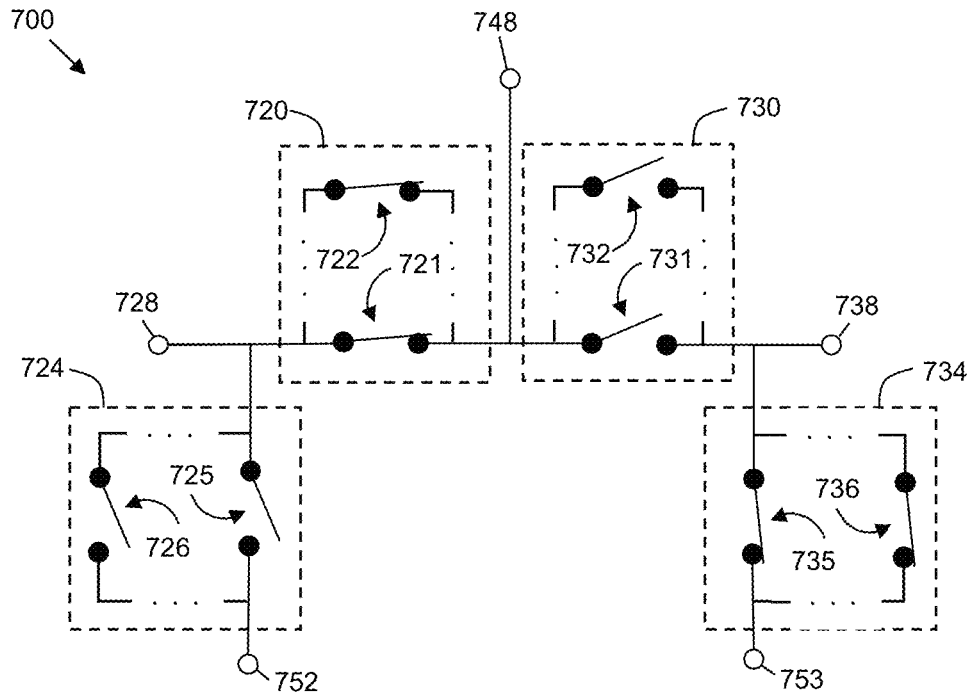
FIG. 7 is a simplified schematic of an RF switch in which all switch branches have parallel stacks in accordance with another exemplary embodiment.

FIG. 7 is a simplified circuit diagram of an RF switch 700 with parallel FET stacks, in accordance with another embodiment. For example, RF switch 700 may provide the functionality of RF switch 1210 (FIG. 12) and/or RF switch 1310 (FIG. 13), described later. RF switch 700 includes a plurality of I/O nodes, including a first I/O node 728 (e.g., node 1228, 1328, FIGS. 12, 13), a second I/O node 738 (e.g., node 1238, 1338, FIGS. 12, 13), a third I/O node 748 (e.g., node 1248, 1348, FIGS. 12, 13), and voltage reference nodes 752, 753, in an embodiment.

Further, RF switch 700 includes a plurality of "branches" 720, 724, 730, 734 electrically coupled between the various nodes 728, 738, 748, 752, 753. As discussed above, a switch "branch" includes the switching circuitry connected between any two nodes of an RF switch. Accordingly, RF switch 700 is shown to include four branches, where a first branch 720 ("TX series branch") includes switch circuitry between nodes 728 and 748, a second branch 724 ("TX shunt branch") includes switch circuitry between nodes 728 and 752, a third branch 730 ("RX series branch") includes switch circuitry between nodes 738 and 748, and a fourth branch 734 ("RX shunt branch") includes switch circuitry between nodes 738 and 753.

Figure 8:
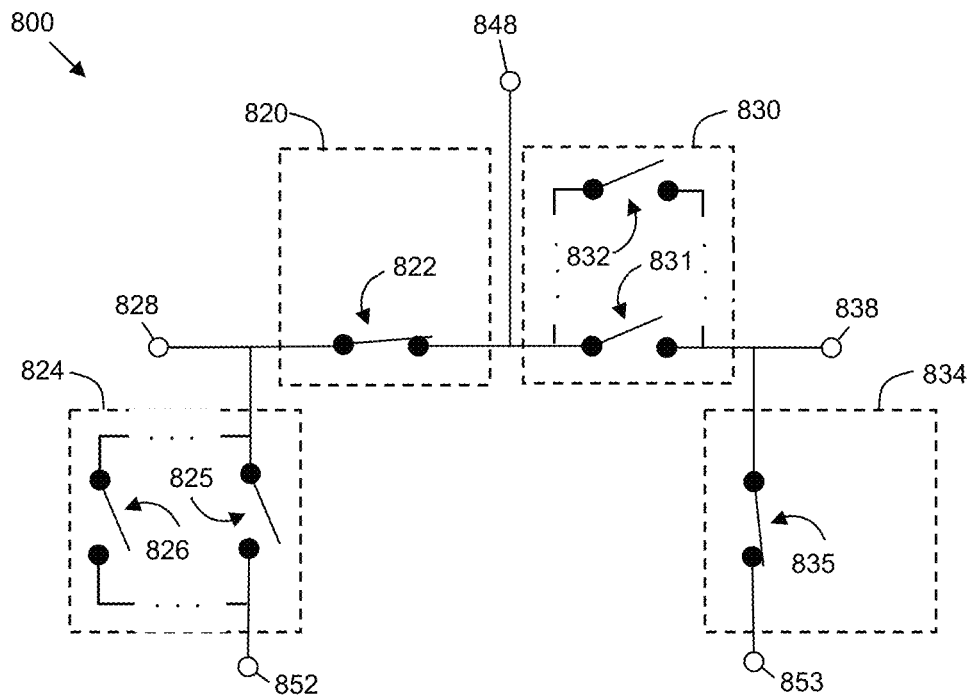
FIG. 8 is a simplified schematic of an RF switch in which a subset of switch branches have parallel stacks in accordance with another exemplary embodiment.

According to the illustrated embodiment, each branch 720, 724, 730, 734 includes multiple parallel-coupled "switches" 721/722, 725/726, 731/732, 735/736. In the context of FIGS. 7 and 8, the term "switch", as it applies to each of elements 721, 722, 725, 726, 731, 732, 735, 736, 822, 825, 826, 831, 832, and 835, may mean a single active switching device (e.g., a single FET) or a plurality of active switching devices (e.g., a FET stack). In the embodiment illustrated in FIG. 7, each branch 720, 724, 730, 734 is shown to include two parallel-coupled switches. However, as indicated by the ellipses between each parallel-coupled set of switches, each branch 720, 724, 730, 734 may include more than two parallel-coupled switches. For example, each branch 720, 724, 730, 734 may include from 2 to m branches, where m may be any integer between 2 and 5. In other embodiments, m may be greater than 5. As will be described in more detail later, the maximum number of parallel-coupled switches in any branch 720, 724, 730, 734 may be equal to the number of drivers in the RF switch controller (e.g., drivers 1251, 1252, 1351, 1352, FIGS. 12, 13).

In some embodiments, the number of parallel-coupled switches in each branch 720, 724, 730, 734 may be the same (e.g., each branch 720, 724, 730, 734 may include two parallel-coupled switches). In other embodiments, the number of parallel-coupled switches in each branch 720, 724, 730, 734 may be different (e.g., branches 720 and 734 each may include two parallel-coupled switches, and branches 724 and 730 each may include three parallel-coupled switches). In still other embodiments, some branches may include multiple parallel-coupled switches, while other branches may include only a single switch.

For example, FIG. 8 is a simplified circuit diagram of an RF switch 800 with parallel switches in only a subset of branches 824, 830, in accordance with an embodiment, while other branches 820, 834 include only a single switch. RF switch 800 also includes a plurality of I/O nodes, including a first I/O node 828 (e.g., node 1228, 1348, FIGS. 12, 13), a second I/O node 838 (e.g., node 1238, 1338, FIGS. 12, 13), a third I/O node 848 (e.g., node 1248, 1328, FIGS. 12, 13), and voltage reference nodes 852, 853, in an embodiment.

According to the illustrated embodiment, each of branches 820 and 834 includes only a single switch 822, 835, whereas each of branches 824, 830 includes multiple parallel-coupled switches 825/826, 831/832. In the embodiment illustrated in FIG. 8, each branch 824, 830 is shown to include two parallel-coupled switches. However, as indicated by the ellipses between each parallel-coupled set of switches, each branch 824, 830 may include more than two parallel-coupled switches. For example, each branch 824, 830 may include from 2 to m parallel-coupled switches, where m may be any integer between 2 and 5. In other embodiments, m may be greater than 5. As will be described in more detail later, the maximum number of parallel-coupled switches in either of branches 824 or 830 may be equal to the number of drivers in the RF switch controller (e.g., drivers 1251, 1252, 1351, 1352, FIGS. 12, 13). Further, the number of parallel-coupled switches in branches 824 and 830 may be equal or unequal.

Although FIG. 8 shows parallel-coupled switches 825/826, 831/832 in two specific branches 824, 830, in other embodiments, parallel-coupled switches may be implemented in only a single branch (e.g., only branch 820, 824, 830, or 834), while each other branch includes only a single switch. In still other embodiments, parallel-coupled switches may be implemented in some other subset of branches (e.g., in branches 820/824, 820/830, 820/834, 820/824/830, 820/824/834, 820/830/834, 824/834, or 830/834), while each other branch includes only a single switch. Either way, in some embodiments, the number of parallel-coupled switches in each branch may be the same, whereas in other embodiments, the number of parallel-coupled switches in each branch may be different.

In accordance with the embodiments described herein, one or more the FET stacks used to implement the switches 721, 722, 725, 726, 731, 732, 735, 736, 822, 825, 826, 831, 832, and 835 can include compensation circuits (e.g., compensation circuits 110, 210, 310, 311, 321, 332, 334, 400, 410, 420, FIGS. 1, 2, 3A-D, 4A-C) configured between one or more FET bodies and gates. And as described above these compensation circuits are implemented to electrically couple the bodies and gates in a way compensates for the effects of the body-source parasitic leakage currents and equalize the drain-source voltages across the FETs in one or more of the switches 721, 722, 725, 726, 731, 732, 735, 736, 822, 825, 826, 831, 832, and 835. It should be noted that, in some embodiments, each of the switches 721, 722, 725, 726, 731, 732, 735, 736, 822, 825, 826, 831, 832, and 835 may include one or more compensation circuits, while in other embodiments, some of the switches 721, 722, 725, 726, 731, 732, 735, 736, 822, 825, 826, 831, 832, and 835 may include one or more compensation circuits, while other ones of the switches 721, 722, 725, 726, 731, 732, 735, 736, 822, 825, 826, 831, 832, and 835 may not include compensation circuits.

Figure 9:
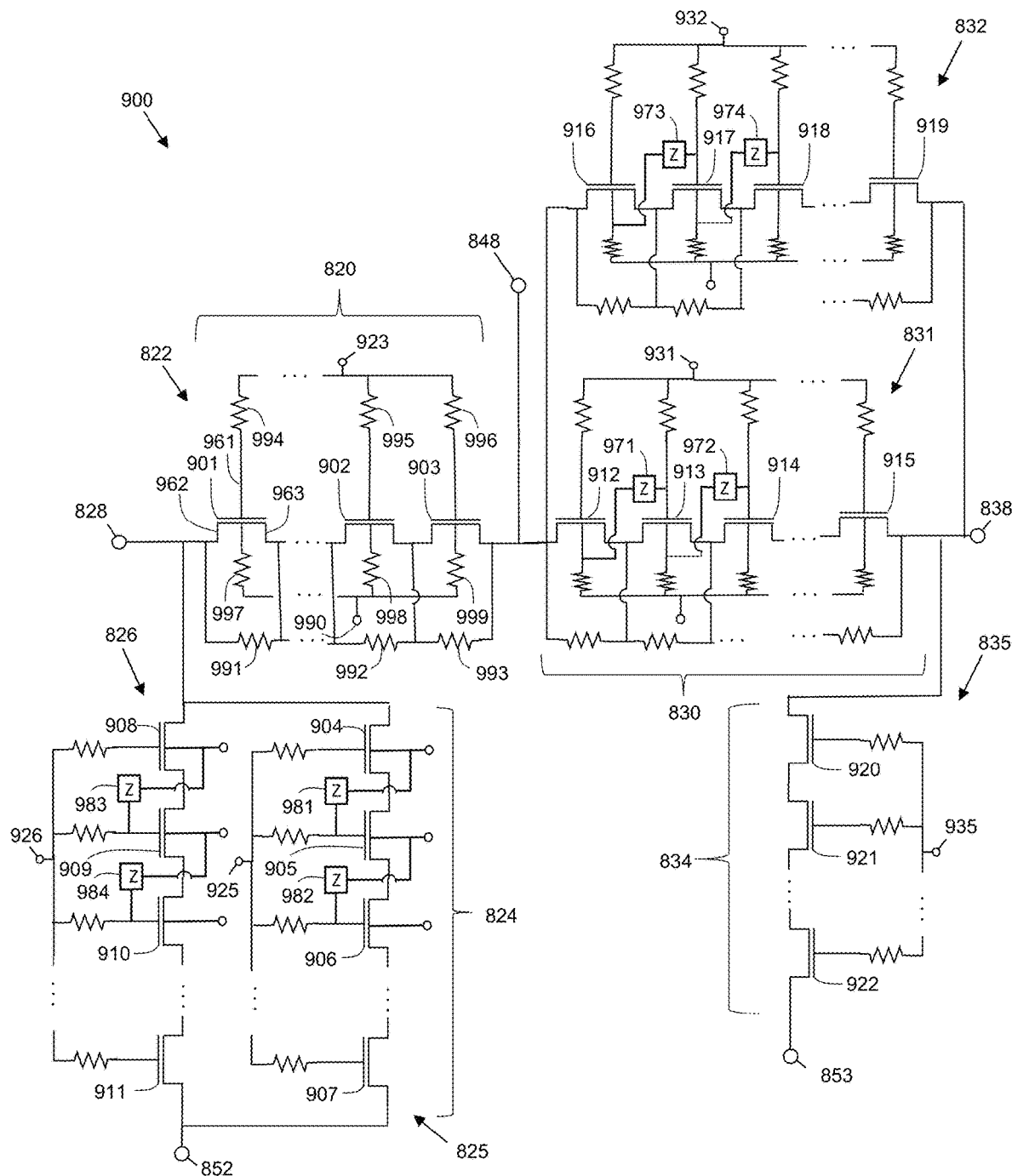
FIG. 9 is a circuit diagram of an RF switch in which a subset of switch branches have parallel stacks in accordance with another exemplary embodiment.

To illustrate various aspects of the inventive subject matter in more detail, FIG. 9 depicts a detailed circuit diagram of an embodiment of an RF switch 900 that corresponds to the RF switch 800 of FIG. 8. In FIG. 9, elements that correspond to the same elements in FIG. 8 have the same reference number (e.g., nodes 828, 838, 848, 852, 853, branches 820, 824, 830, 834, and switches 822, 825, 826, 831, 832, 835).

According to an embodiment, in FIGS. 7-9, each switch 721, 722, 725, 726, 731, 732, 735, 736, 822, 825, 826, 831, 832, 835 is implemented as a stack of series-coupled FETs 901-903, 904-907, 908-911, 912-915, 916-919, 920-922 that is electrically coupled between two nodes. In branches that include only a single switch (e.g., branches 820, 834, FIGS. 8, 9), a single stack of series-coupled FETs is electrically coupled between the respective nodes, whereas in branches that include multiple, parallel-coupled switches (e.g., branches 720, 724, 730, 734, 824, 830), multiple parallel stacks of series-coupled FETs are electrically coupled between the respective nodes.

According to the embodiment illustrated in FIGS. 8 and 9, branch 820 includes a single switch 822, which may be implemented as a first stack of series-coupled FETs 901, 902, 903 that are electrically coupled between node 828 and node 848. Branch 824 includes two, parallel-coupled switches 825, 826, which may be implemented as second and third stacks of series-coupled FETs 904, 905, 906, 907 and 908, 909, 910, 911 respectively, that are electrically coupled between node 828 and node 852. Branch 830 also includes two, parallel-coupled switches 831, 832, which may be implemented as fourth and fifth stacks of series-coupled FETs 912, 913, 914, 915 and 916, 917, 918, 919 respectively, that are electrically coupled between node 838 and node 848. Finally, branch 834 includes a single switch 835, which may be implemented as a sixth stack of series-coupled FETs 920, 921, 922 that are electrically coupled between node 838 and node 853. When incorporated into a larger electrical system, nodes 852 and 853 typically would be coupled to a ground reference (e.g., zero volts), although nodes 852 and 853 alternatively could be coupled to a positive or negative DC voltage reference, as well.

As discussed previously, each FET 901-922 includes a source terminal (e.g., terminal 962 of FET 901), a drain terminal (e.g., terminal 963 of FET 901), and a gate terminal (e.g., gate terminal 961 of FET 901). The electrical conductivity of a variable-conductivity channel between the source and drain terminals of any given FET is controlled by control signals provided to the FET's gate terminal (e.g., terminal 961). Some (and possibly all) of the above-discussed FETs may be "single-gate FETs", although some or all of the FETs may be "multiple-gate FETs", as well.

In the series-coupled sequence of FETs corresponding to switch 822, the drain terminal 962 of FET 901 may be coupled to I/O node 828, the source terminal 963 of FET 901 may be coupled to the drain terminal of FET 902, the source terminal of FET 902 may be coupled to the drain terminal of FET 903, and the source terminal of FET 903 may be coupled to I/O node 848. The FETs in the other switches 825, 826, 831, 832, 835 are similarly connected in series.

As indicated previously in conjunction with FIG. 6, and according to an embodiment, during operation, the control signals provided to the series-coupled FETs in any particular switch 822, 825, 826, 831, 832, 835 are synchronous, in that they simultaneously cause all of the FETs in that switch either to be substantially conducting (e.g., "on" or "closed") or substantially non-conducting (e.g., "off" or "open"). As mentioned previously, to accomplish simultaneous control of all FETs in each switch, the gate terminals of the FETs in each switch may be electrically coupled to a single stack control terminal (e.g., a terminal accepting a "CONTROL" or a" CONTROL" signal, as discussed in conjunction with FIG. 6). For example, in FIG. 9, the gate terminals of FETs 901-903 are electrically coupled to stack control terminal 923, the gate terminals of FETs 904-907 are electrically coupled to stack control terminal 925, the gate terminals of FETs 908-911 are electrically coupled to stack control terminal 926, the gate terminals of FETs 912-915 are electrically coupled to stack control terminal 931, the gate terminals of FETs 916-919 are electrically coupled to stack control terminal 932, and the gate terminals of FETs 920-922 are electrically coupled to stack control terminal 935.

As indicated previously, a system that includes RF switch 900 may include a switch controller (e.g., switch controller 1250, 1350, FIGS. 12, 13) with multiple drivers (e.g., drivers 1251, 1252, 1351, 1352, FIGS. 12, 13), and each driver is coupled to one or more of the stack control terminals 923, 925, 926, 931, 932, 935 of the switches 822, 825, 826, 831, 832, 835. To cause an entire switch to become substantially conductive between the nodes to which the switch is connected (e.g., to turn the switch "on" or to "close" the switch), the driver that is connected to the control node associated with that switch provides a control signal (or "drive signal") to the control node, and that control signal causes all of the FETs within the switch simultaneously to become substantially conducting. For example, a driver (e.g., driver 1251, 1351) coupled to stack control terminal 923 may provide a control signal to terminal 923, which simultaneously causes all of FETs 901-903 to become substantially conducting (e.g., to "turn on" or "close"), thus causing switch 822 to become substantially conductive between nodes 828 and 848. Alternatively, the driver may provide a control signal to terminal 923, which simultaneously causes all of FETs 901-903 to become substantially non-conducting (e.g., to "turn off" or "open"), thus causing switch 822 to become substantially non-conductive between nodes 828 and 848.

Further, according to an embodiment, in branches that include multiple, parallel-coupled switches/stacks (e.g., branches 824 and 830), the control signals provided to the FETs of the parallel-coupled switches of the branch also are synchronous, in that they simultaneously cause all of the FETs in that entire branch either to be substantially conducting (e.g., "on" or "closed") or substantially non-conducting (e.g., "off" or "open"). Although a single driver could provide control signals to all of the FETs of the parallel-coupled switches of a branch, separate drivers (e.g., drivers 1251, 1252, 1351, 1352, FIGS. 12, 13) may be used to drive each of the multiple switches in any given multi-switch branch. For example, in the branch between nodes 838 and 848, a first driver (e.g., driver 1251, 1351, FIGS. 12, 13) may be coupled to stack control terminal 931, and that driver may provide a control signal to stack control terminal 931. A second driver (e.g., driver 1252, 1352, FIGS. 12, 13) may be coupled to stack control terminal 932, and that driver may provide a second control signal to stack control terminal 932. To turn switches 831 and 832 on or off synchronously, the control signals provided by the first and second driver are synchronous. Said another way, separate drivers may be used to drive the parallel-coupled switches/stacks of any given branch synchronously, according to an embodiment, and those drivers may be operated to synchronously turn parallel switches in any given branch on and off.

According to an embodiment the RF switch 900 also includes a first plurality of compensation circuits 971-974, in FET stacks 831, 832, each of the first plurality of compensation circuits 971-974 coupling a gate on one FET in the stack 831, 832 to a body on another one of the FETs in the stack 831, 832. In the embodiment depicted in FIG. 9, the compensation circuits 971-974 are arranged similarly to the embodiment depicted in FIG. 3D. More particularly, first compensation circuits 971, 973 are implemented to electrically couple the bodies of the first FETs 912, 916 in each stack 831, 832 to the gates of the second FETs 913, 917 in each stack 831, 832. Likewise, second compensation circuits 972, 974 are implemented to electrically couple the bodies of the second FETs 913, 917 to the gates of the third FETs 914, 918. Although one or more additional compensation circuits may be implemented between subsequent FETs in the stacks 831, 832 (e.g., more than two compensation circuits may be included toward the input sides of the stacks 831, 832), it should be noted that no compensation circuits are implemented at the output side of the stacks 831, 832 (e.g., between the second-to last FET in each stack and the last FET 915, 919 in each stack 831, 832). Accordingly, compensation circuits 971-974 are implemented to electrically coupled adjacent FETs 912-914 and 916-918 at the "input side" of each FET stack 831, 832, but the FET stacks 831, 832 do not include compensation circuits that are electrically coupled to FETs (e.g., FETs 915, 919) on the "output side" of the FET stacks 831, 832. And again, each compensation circuit 971-974 includes an impedance $Z_C$ implemented to compensate for the effects of the body-source parasitic leakage currents. It should be noted that any of the FET stacks 300, 320, 330, 340 with their associated compensation circuits depicted in FIGS. 3A, 3B, 3C, and 3D may be implemented in FET stacks 830, 831 along with any alternate embodiments of such FET stacks 300, 320, 330, 340 discussed above.

The RF switch 900 can also include a second plurality of compensation circuits 981-984 in FET stacks 825, 826, each of the second plurality of compensation circuits 981-984 coupling a gate on one FET in the stack 825, 826 to a body on another one of the FETs in the stack 825, 826. In the embodiment depicted in FIG. 9, the compensation circuits 971-974 are arranged similarly to the embodiment depicted in FIG. 3D. More particularly, first compensation circuits 981, 983 are implemented to electrically couple the bodies of the first FETs 904, 908 in each stack 825, 826 to the gates of the second FETs 905, 909 in each stack 825, 826. Likewise, second compensation circuits 982, 984 are implemented to electrically couple the bodies of the second FETs 905, 909 to the gates of the third FETs 906, 910. Although one or more additional compensation circuits may be implemented between subsequent FETs in the stacks 825, 826 (e.g., more than two compensation circuits may be included toward the input sides of the stacks 825, 826), it should be noted that no compensation circuits are implemented at the output side of the stacks 825, 826 (e.g., between the second-to last FET in each stack and the last FET 907, 911 in each stack 825, 826). Accordingly, compensation circuits 981-984 are implemented to electrically coupled adjacent FETs 904-906 and 908-910 at the "input side" of each FET stack 825, 826, but the FET stacks 825, 826 do not include compensation circuits that are electrically coupled to FETs (e.g., FETs 907, 911) on the "output side" of the FET stacks 825, 826. And again, each compensation circuit 981-984 includes an impedance $Z_C$ implemented to compensate for the effects of the body-source parasitic leakage currents. Again, any of the FET stacks 300, 320, 330, 340 with their associated compensation circuits depicted in FIGS. 3A, 3B, 3C, and 3D may be implemented in FET stacks 825, 826, along with any alternate embodiments of such FET stacks 300, 320, 330, 340 discussed above. Further, although FET stacks 822, and 835 are depicted without compensation circuits in FIG. 9, in other embodiments, either or both of FET stacks 822, 835 may include any of the FET stacks 300, 320, 330, 340 with their associated compensation circuits depicted in FIGS. 3A, 3B, 3C, and 3D, along with the alternate embodiments of such FET stacks 300, 320, 330, 340 discussed above.

According to a further embodiment, the number of FETS, gate width of FETs, number of compensation circuits, placement of compensation circuits in the stack, and configuration of compensation circuits (e.g., configurations including but not limited to those depicted in FIGS. 4A-C) are substantially identical between the first and second FET stacks 825, 826.

As will now be explained, the above-described configuration of a branch that includes multiple-parallel coupled FET stacks (e.g., the branch between nodes 838 and 848 or the branch between nodes 828 and 852) may have improved settling time, in comparison to a conventional branch with a single FET stack that is designed to conduct signals with the same level of power. More specifically, during operation, an RF signal conveyed through a branch with multiple parallel-coupled FET stacks is divided between the parallel stacks. When the parallel-coupled FET stacks are substantially identical, each stack would convey approximately 50 percent of the total power of the RF signal. Accordingly, in comparison with a conventional switch branch that includes only a single stack designed to conduct a signal of the same power, the parallel-coupled FET stacks of the present embodiments need only to be designed to conduct signals of approximately half power in each stack. Thus, given the same signal power conveyed through a branch with parallel-coupled FET stacks and a conventional branch with a single stack, the FETs in the parallel-coupled FET stacks may be smaller in gate width/periphery. For example, a conventional RF switch may include a single FET stack between switch nodes in which each FET has a 4 millimeter (mm) gate width, whereas each parallel-coupled FET stack may include FETs with only a 2 mm gate width. Said another way, in a switch that includes a first switch branch with one FET stack having a total gate width of x, and a second switch branch with y FET stacks implemented in parallel, the total gate width of each of the FET stacks in the second switch branch may be approximately x/y.

Further, the parasitic capacitance on the gate of a FET is proportional to the gate width. Thus, the relatively small FETs associated with the various embodiments have shorter gate widths and thus lower gate capacitance, Cgate, when compared with their larger counterparts in a conventional single-stack branch. By parallel-coupling the FET stacks, in accordance with various embodiments, the time constants of the relatively small FETs in the parallel-coupled FET stacks also are smaller than the time constants of their larger conventional counterparts. The time constants of the FETs are lowered by paralleling the FET stacks (i.e., time constant=Rgate*Cgate; where Rgate is the gate resistance, and Cgate is proportional to the width of the FET). As the time constant is lowered, the time to switch from one mode to another also is lowered, assuming the drive level (i.e., the current level used to drive the Cgate) is not changed, or equivalently when each of the parallel stacks (which have lowered Cgate) is driven with the same drive (or current) level as would be used to drive a functionally equivalent single stack FET. This may result in a significantly faster (e.g., about 50 percent faster) settling time associated with switching between transmit and receive states, when using implementations of the various embodiments, when compared with the settling times for conventional RF switches.

In FIG. 9, each of the switches 820, 825, 826, 831, 832, 835 is shown to include a stack of three series-coupled FETs 901-903, 904-906, 907-909, 910-912, 913-915, and 916-922. Although each of the switches 820, 825, 826, 831, 832, 835 may include a stack of three series-coupled FETs in some embodiments, some of the switches 820, 825, 826, 831, 832, 835 alternatively may include a single FET, two FETs, or more than three FETs (as indicated with the ellipses in each FET stack). In some embodiments, either or both of the shunt branches 824, 834 may not include any FETs, and instead node 828 and/or node 838 could be directly coupled to the corresponding voltage reference nodes 852, 853, respectively.

According to an embodiment, the parallel-coupled switches (or the parallel-coupled FET stacks) in a same branch are substantially identical (e.g., switches 831 and 832 are substantially identical), although switches in different branches may be different from each other (e.g., switches 831 and 825 may be different, although they may be substantially identical, as well). More specifically, within a same branch, each of the parallel-coupled switches may include the same number of series-coupled FETs, with the same total periphery and/or gate width. In other embodiments, the parallel-coupled switches (or the parallel-coupled FET stacks) in a same branch may be different from each other (e.g., they may have a different number of parallel-coupled FETs, and/or they may have different total peripheries and/or gate widths).

In addition to the FETs and compensation circuits, each stack may include a DC bias distribution network of high-value (e.g., multiple kiloohm) resistors (e.g., resistors 991-993, FIG. 9), in an embodiment, where each resistor is coupled between the source and drain terminals of a FET. The DC bias distribution network essentially ensures that the DC bias voltage provided to the drains/sources of each FET in the stack is the same. Although DC bias distribution networks are shown only in switches 822, 831, 832 in FIG. 9, such networks also may be included in switches 825, 826, and 835.

Each stack also may include an RF blocking network of high-value (e.g., multiple kiloohm) resistors (e.g., resistors 994-996, FIG. 9) coupled between the gate terminals of the FETs and the stack control terminal (e.g., stack control terminal 923, FIG. 9) for the stack, in an embodiment. The RF blocking network presents a high impedance to RF signal energy to ensure that the RF signal energy conveyed through a branch does not leak to the control/driver circuitry (e.g., to controller 1250, 1350, FIGS. 12, 13).

Further still, each stack also may include body bias circuitry coupled between the body node of each FET, if included, and a body bias terminal (e.g., body bias terminal 990, FIG. 9). The body bias circuitry also may include an RF blocking network of high-value (e.g., multiple kiloohm) resistors (e.g., resistors 997-999, FIG. 9) coupled between the body nodes of the FETs and the body bias terminal for the stack, in an embodiment. Again, the RF blocking network presents a high impedance to RF signal energy to ensure that the RF signal energy conveyed through a branch does not leak to the body bias circuitry (not illustrated). Although body bias circuitry is shown only in switches 822, 831, 832 in FIG. 9, such circuitry also may be included in switches 825, 826, and 835.

As described previously, the state of an RF switch is controlled (e.g., by RF switch controller 1250, 1350, FIGS. 12, 13) based on whether the system (e.g., transceiver 1200, 1300, FIGS. 12, 13) is in a transmit mode or a receive mode (e.g., during a transmit time interval or a receive time interval, respectively, of a wireless communication session). More specifically, when the system is in a transmit mode, the state of the RF switch is controlled (e.g., using "CONTROL" and "CONTROL" signals applied to stack control terminals 923 and 931/932, respectively) to establish a low-impedance connection between node 548, 648, 748, 848 and node 528, 628, 728, 828, and to establish a high-impedance between node 548, 648, 748, 848 and node 538, 638, 738, 838. Further, in the transmit mode, the state of the RF switch is controlled (e.g., using "CONTROL" and "CONTROL" signals applied to stack control terminals 935 and 925/926, respectively) to establish a low-impedance connection between node 738, 838 and node 753, 853, and to establish a high-impedance between node 728, 828 and node 752, 852. In other words, in the transmit mode, switches 721, 722, 735, 736, 822, 835 are closed, and switches 725, 726, 731, 732, 831, 832 are open. Referring to FIG. 9, this means that the RF switch controller sends control signals to stack control terminals 923 and 935 to cause FETs 901-903 and 916-922 to be in a substantially conducting state, and the RF switch controller sends control signals to stack control terminals 926, 931, and 932 to cause FETs 904-909 and 910-915 to be in a substantially non-conducting state. Accordingly, in the transmit state, signal energy present at node 828 is conveyed through switch 822 (or branch 820) to node 848, and the conductive path between node 828 and voltage reference node 852 is open. In addition, in the transmit state, signal energy present at node 838 is conveyed through switch 835 (or branch 834) to voltage reference node 853, and the conductive path between node 838 and node 848 is open.

Conversely, when the system is in a receive mode, the state of the RF switch is controlled to establish a low-impedance connection between node 548, 648, 748, 848 and node 538, 638, 738, 838, and to establish a high-impedance between node 548, 648, 748, 848 and node 528, 628, 728, 828. Further, in the receive mode, the state of the RF switch is controlled to establish a low-impedance connection between node 728, 828 and node 752, 852, and to establish a high-impedance between node 738, 838 and node 753, 853. In other words, in the receive mode, switches 725, 726, 731, 732, 831, 832 are closed, and switches 721, 722, 735, 736, 822, 835 are open. Referring to FIG. 9, this means that the RF switch controller sends control signals to stack control terminals 923 and 935 to cause FETs 901-903 and 916-922 to be in a substantially non-conducting state, and the RF switch controller sends control signals to stack control terminals 926, 931, and 932 to cause FETs 904-909 and 910-915 to be in a substantially conducting state. Accordingly, in the receive state, signal energy present at node 838 is conveyed through switches 831 and 832 (or branch 830) to node 848, and the conductive path between node 838 and voltage reference node 853 is open. In addition, in the receive state, signal energy present at node 828 is conveyed through switches 825 and 826 (or branch 824) to voltage reference node 852, and the conductive path between node 828 and node 848 is open.

Figure 10A:
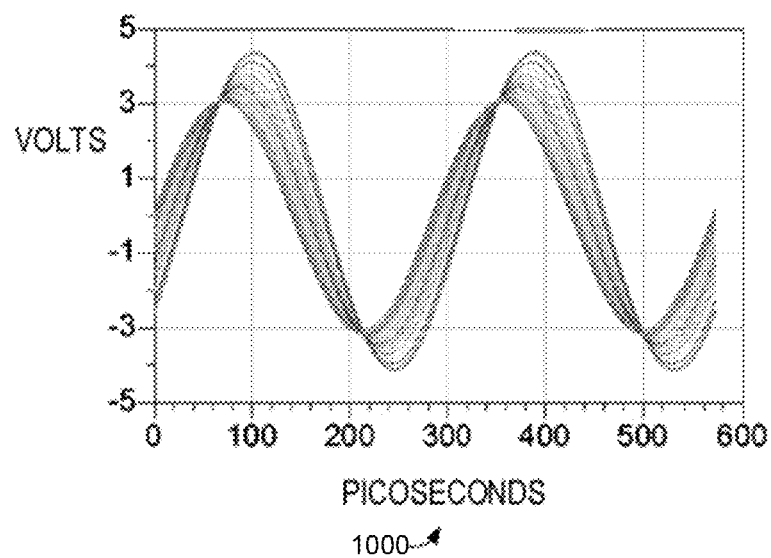
FIGS. 10A and 10B are graphical representations of voltage waveforms in FET stacks in accordance with exemplary embodiments.

Turning now to FIG. 10A, graph 1000 shows exemplary voltage waveforms as would be present across FETs in an exemplary FET stack that does not implement the improvements disclosed herein. Specifically, each of the waveforms in the graph 1000 illustrates an exemplary voltage across one FET in a stack of FETs when the FETs are turned off to provide an open circuit and while an RF voltage is present on one side of the FET stack.

Specifically, graph 1000 depicts the waveform amplitudes and resulting potential difference between the drain and source nodes of the different FETs in the FET stack. As can be seen in graph 1000, the voltage amplitudes across the different FETs in the FET stack have significant variation from FET to FET. Specifically, in this example, some FETs have a drain source voltage of as much as 4.2 volts, while other FETs in the same stack have a drain source voltage of as little as 3.0 volts. Thus, the FETs in graph 1000 have non-uniformity variation of 1.2 volts.

As was described above, this variation in voltages across the FETs can be caused in part by an unequal amount of source-drain leakage currents resulting from body-substrate parasitic leakage currents. This variation can cause the voltage across some FETs to exceed the breakdown voltage and potentially begin significant current conduction while other FETs with lower source-drain voltages are still below their breakdown voltage. As one example, each of the FETs in the stack may have a breakdown voltage of 3.6 volts as determined by the semiconductor fabrication used to form the FETs. In such an embodiment the variation illustrated in graph 1000 will likely result in the source drain voltages across one or more FETs being significantly above 3.6 volts. Thus, one or more of the FETs is likely to prematurely enter the breakdown region before others of the FETs. Thus, these relatively large variations in voltage waveforms across the FETs can reduce the voltage handling capacity of the overall FET stack.

Figure 10B:
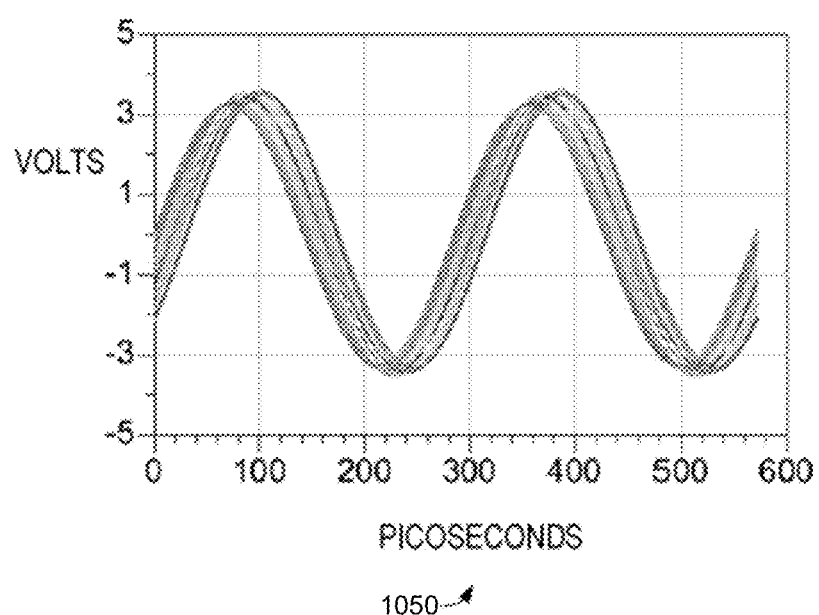

Turning now to FIG. 10B, graph 1050 shows exemplary voltage waveforms as would be present across FETs in an exemplary FET stack that includes one or more compensation circuits in accordance with the embodiments described herein (e.g., FET stacks 112, 200, 300, 320, 330, 340, 624, 630, 825, 826, 831, 832). As can be seen in graph 1050 the amplitude variation in the voltage waveform across the FETs is significantly reduced by the compensation circuits, in comparison with the results of graph 1000 (FIG. 10A). Specifically, in the example of graph 1050 the voltage waveforms have a maximum amplitude variation of only 0.67 volts, and a maximum voltage across any FET of 3.596 volts, which is well below the breakdown voltage of many typical FETs used in FET stacks. This reduced variation in voltage waveforms across the FETs can thus increase the voltage handling capacity of the overall FET stack.

Figure 11:
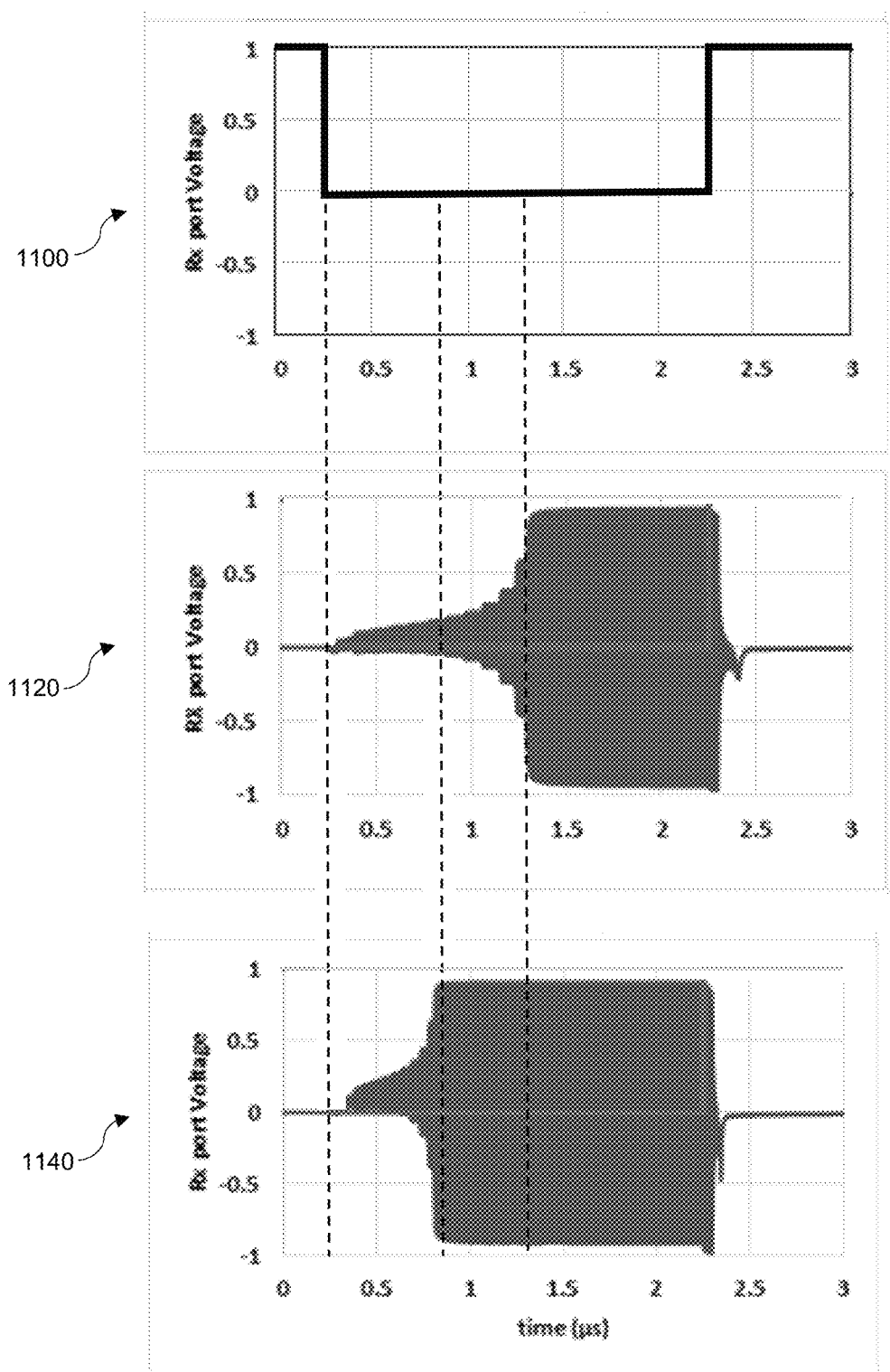
FIG. 11 is another graphical representation of voltage waveforms in FET stacks in accordance with other exemplary embodiments.

Turning now to FIG. 11, a timing diagram 1100 is illustrated, which indicates a voltage signal supplied to an input node of a FET stack as a function of time. In addition, FIG. 11 depicts a first graph 1120 that shows the settling time of voltage with respect to time across a switch branch that does not implement parallel FET stacks (e.g., branch 630, FIG. 6), and a second graph 1140 that shows the settling time of voltage with respect to time across a switch branch that does implement parallel FET stacks (e.g., branch 830, FIG. 8), in accordance with an embodiment.

More specifically, timing diagram 1100 shows that, at 0.25 seconds, the applied voltage signal provided at the input node of a FET stack drops to zero, which may correspond, for example, to switching between transmit and receive states of an RF switch. Graph 1120 shows that it takes approximately 1.0 microseconds for the voltage to settle across a switch branch that does not implement parallel FET stacks, whereas graph 1140 shows that it takes approximately 0.6 microseconds for the voltage to settle across a switch branch that does implement parallel FET stacks.

As explained previously, a switch branch that implements parallel FET stacks utilizes relatively small FETs (e.g., about half the size when two parallel stacks are implemented) when compared with a functionally equivalent switch branch that does not implement parallel FET stacks. Because the relatively small FETs have relatively lower gate capacitance when compared with their larger counterparts, the time constants of the relatively small FETs also are smaller than the time constants of their larger counterparts. Accordingly, the settling time associated with switching between transmit and receive states may be relatively fast using implementations of the various embodiments, when compared with the settling times for conventional RF switches. This may enable systems to support faster transmit/receive mode switching speeds, and thus higher data throughput.

Turning now to FIG. 12 a simplified block diagram of an example of a radio frequency (RF) transceiver system 1200 is illustrated. RF transceiver system 1200 includes an RF switch 1210, a transmitter 1220, a receiver 1230, an antenna 1240, and an RF switch controller 1250. Transceiver system 1200 is a half-duplex transceiver, in which only one of the transmitter 1220 or the receiver 1230 are coupled, through the RF switch 1210, to the antenna 1240 at any given time. More specifically, the state of the RF switch 1210 is controlled by RF switch controller 1250 to alternate between coupling an RF transmit signal produced by the transmitter 1220 to the antenna 1240, or coupling an RF receive signal received by the antenna 1240 to the receiver 1230.

The transmitter 1220 may include, for example, a transmit (TX) signal processor 1222 and a power amplifier 1224. The transmit signal processor 1222 is configured to produce transmit signals, and to provide the transmit signals to the power amplifier 1224. The power amplifier 1224 amplifies the transmit signals, and provides the amplified transmit signals to the RF switch 1210. The receiver 1230 may include, for example, a receive amplifier 1232 (e.g., a low noise amplifier) and a receive (RX) signal processor 1234. The receive amplifier 1232 is configured to amplify relatively low power received signals from the RF switch 1210, and to provide the amplified received signals to the receive signal processor 1234. The receive signal processor 1234 is configured to consume or process the receive signals.

During each transmit time interval, when the transceiver 1200 is in a "transmit mode," the RF switch controller 1250 controls the RF switch 1210 to be in a first or "transmit" state, as depicted in FIG. 12, in which a conductive transmit signal path is established between transmitter node 1228 and I/O node 1248 (referred to below as "antenna node", since it is coupled to antenna 1240), and in which a receive signal path is in a high impedance state (e.g., open circuit) between antenna node 1248 and receiver node 1238. Conversely, during each receive time interval, when the transceiver 1200 is in a "receive mode," the RF switch controller 1250 controls the RF switch 1210 to be in a second or "receive" state, in which a conductive receive signal path, indicated by a dashed line in FIG. 12, is established between antenna node 1248 and receiver node 1238, and in which the transmit signal path is in a high impedance state (e.g., open circuit) between transmitter node 1228 and antenna node 1248.

According to an embodiment, the RF switch controller 1250 includes up to n drivers, D1-Dn, 1251, 1252. In embodiments that do not implement parallel FET stacks (e.g., the embodiments illustrated in FIGS. 5 and 6), n may equal 1. In embodiments that implement multiple parallel FET stacks (e.g., the embodiments illustrated in FIGS. 7-9), n is the maximum number of parallel switches or FET stacks (e.g., parallel switches 731/732, 725/726, 831/832, 825/826, FIGS. 7-9) in any branch of the RF switch 1210, and each driver 1251-1252 is used to turn the FETs in a given stack on and off (i.e., to render the FET channels conducting or non-conducting). According to an embodiment, n may be any integer between 2 and 5, although n may be greater than 5, as well.

If any of RF switches 500, 600, 700, 800, 900 (FIGS. 5-9) were implemented in the transceiver 1200 of FIG. 12, for example, node 528/628/728/828 may correspond to node 1228, and thus may be coupled to transmitter 1220. Node 538/638/738/838 may correspond to node 1238, and thus may be coupled to receiver 1230. Node 548/648/748/848 may correspond to node 1248, and thus may be coupled to antenna 1240. Finally, nodes 552, 553, 652, 653, 752, 753, 852, 853 may be coupled to ground reference nodes. In an alternate embodiment, if any of RF switches 500, 600, 700, 800 were implemented in the transceiver of FIG. 12, node 528/628/728/828 may correspond to node 1238, and thus may be coupled to receiver 1230, and node 538/638/738/838 may correspond to node 1228, and thus may be coupled to transmitter 1220.

FIG. 13 is a simplified block diagram of another example of RF transceiver system 1300 that includes an RF switch 1310, a circulator 1316, a transmitter 1320, a receiver 1330, an antenna 1340, and an RF switch controller 1350. The transmitter 1320 and the receiver 1330 are coupled to the antenna 1340 through the circulator 1316. More specifically, the circulator 1316 is a three-port device, with a first port 1317 coupled to the transmitter 1320, a second port 1318 couplable to the receiver 1330 through RF switch 1310, and a third port 1319 coupled to the antenna 1340. The RF switch 1310 includes a first I/O node 1348 (also referred to as a "circulator node") coupled to the receiver port 1318 of the circulator 1316, a second I/O node 1338 coupled to the receiver 1330, and a third I/O node 1328 coupled to a ground reference node 1354 through a resistor 1356.

Again, the transmitter 1320 may include, for example, a TX signal processor 1322 and a power amplifier 1324. The transmit signal processor 1322 is configured to produce transmit signals, and to provide the transmit signals to the power amplifier 1324. The power amplifier 1324 amplifies the transmit signals, and provides the amplified transmit signals to the antenna 1340 through the circulator 1316. The receiver 1330 may include, for example, a receive amplifier 1332 (e.g., a low noise amplifier) and an RX signal processor 1334. The receive amplifier 1332 is configured to amplify relatively low power received signals received from the antenna 1340 (through the circulator 1316 and the RF switch 1310), and to provide the amplified received signals to the receive signal processor 1334. The receive signal processor 1334 is configured to consume or process the receive signals.

The circulator 1316 is characterized by a signal-conduction directivity, which is indicated by the arrows within the depiction of circulator 1316. Essentially, RF signals may be conveyed between the circulator ports 1317-1319 in the indicated direction (counter-clockwise), and not in the opposite direction (clockwise). Accordingly, during normal operations, signals may be conveyed through the circulator 1316 from transmitter port 1317 to antenna port 1319, and from antenna port 1319 to receiver port 1318, but not directly from transmitter port 1317 to receiver port 1318 or from receiver port 1318 to antenna port 1319.

In some situations, while the transceiver 1300 is in the transmit mode, the circulator 1316 may not be able to convey signal energy received through transmitter port 1317 from the transmitter 1320 to the antenna 1340 through antenna port 1319. For example, the antenna 1340 may be disconnected from the antenna port 1319, or may otherwise be in a very high impedance state. In such situations, the circulator 1316 may convey signal energy from the transmitter 1320 (i.e., signal energy received through transmitter port 1317) past the antenna port 1319 to the receiver port 1318. To avoid conveying transmitter signal energy into the receiver 1330 while the transceiver 1300 is in the transmit mode, the RF switch controller 1350 operates the RF switch 1310 as a fail-safe switch by coupling the first I/O node 1348 to a ground reference node 1354.

More specifically, when the transceiver 1300 is in a receive mode, the RF switch 1310 is controlled by RF switch controller 1350 to be in a receive state, as shown in FIG. 13. In the receive state, the receiver port 1318 of the circulator 1316 is coupled through RF switch 1310 to the receiver 1330 (i.e., RF switch controller 1350 configures RF switch 1310 to have a conductive path between I/O nodes 1348 and 1338, and a high-impedance, open-circuit condition between nodes 1348 and 1328). Conversely, when the transceiver 1300 is in a transmit mode, the RF switch 1310 is controlled by RF switch controller 1350 to be in a transmit state, in which the receiver port 1318 of the circulator 1316 is coupled through the RF switch 1310 to the ground termination 1354 through resistor 1356 (i.e., RF switch controller 1350 configures RF switch 1310 to have a conductive path, indicated by a dashed line in FIG. 13, between I/O nodes 1348 and 1328, and a high-impedance, open-circuit condition between nodes 1348 and 1338). Accordingly, if the transmitter signal energy bypasses the antenna port 1319 while the transceiver 1300 is in the transmit mode, any signal energy that is conveyed through the receiver port 1318 of the circulator 1316 to the RF switch 1310 will be shunted to the ground termination 1354 through node 1328 of the RF switch 1310.

According to an embodiment, the RF switch controller 1350 includes up to n drivers, D1-Dn, 1351, 1352. Again, in embodiments that do not implement parallel FET stacks (e.g., the embodiments illustrated in FIGS. 5 and 6), n may equal 1. In embodiments that implement multiple parallel FET stacks (e.g., the embodiments illustrated in FIGS. 7-9), n is the maximum number of parallel switches or FET stacks (e.g., parallel switches 731/732, 725/726, 831/832, 825/826, FIGS. 7-9) in any branch of the RF switch 1210, and each driver 1251-1252 is used to turn the FETs in a given stack on and off (i.e., to render the FET channels conducting or non-conducting). According to an embodiment, n may be any integer between 2 and 5, although n may be greater than 5, as well.

If any of RF switches 500, 600, 700, 800, 900 (FIGS. 5-9) were implemented in the transceiver 1300 of FIG. 13, for example, node 548/648/748/848 may correspond to node 1348, and thus may be coupled to the receiver node 1318 of circulator 1316. Node 538/638/738/838 may correspond to node 1338, and thus may be coupled to receiver 1330. Node 528/628/728/828 may correspond to node 1328, and thus may be coupled to ground reference node 1354 through resistor 1356. Finally, nodes 552, 553, 652, 653, 752, 753, 852, 853 also may be coupled to ground reference nodes. In an alternate embodiment, if any of RF switches 500, 600, 700, 800 were implemented in the transceiver of FIG. 13, node 528/628/728/828 may correspond to node 1338, and thus may be coupled to receiver node 1318 of circulator 1316, and node 538/638/738/838 may correspond to node 1328, and thus may be coupled to ground reference node 1354 through resistor 1356.

The RF transceiver systems 1200, 1300 may be physically implemented using a variety of active and passive electrical devices, which may be housed on one or more printed circuit boards (PCBs) and/or other substrates. To facilitate assembly of such a system, various components of the RF transceiver systems 1200, 1300 may be implemented in self-contained modules or electrical devices, which may be coupled to a PCB that electrically connects the module/devices to other portions of the RF transceiver systems 1200, 1300. As used herein, the terms "module" and "device" mean a set of active and/or passive electrical devices (e.g., ICs and components) that are physically contained within a single housing (e.g., the device(s) are included on a common substrate (referred to herein as a "module substrate") or within a single electronics package. A "module" or "device" also includes a plurality of conductive terminals for electrically connecting the set of internal devices to external circuitry that forms other portions of an electrical system. Essentially, the module/device substrate configuration, the method of coupling the internal device(s) to the module's/device's terminals, and the number of devices within the module/device defines the module/device type. For example, in various embodiments, a module/device may be in the form of a surface mount device, a chip carrier device, a ball, pin, or land grid array device, a flat no-leads packaged device (e.g., a quad or dual flat no-leads package), a chip scale packaged device, a system-in-package (SiP) device, or in the form of some other type of integrated circuit package. Although a particular type of module/device is described below, it is to be understood that embodiments of the inventive subject matter may be included in other types of modules/devices, as well.

Figure 14:
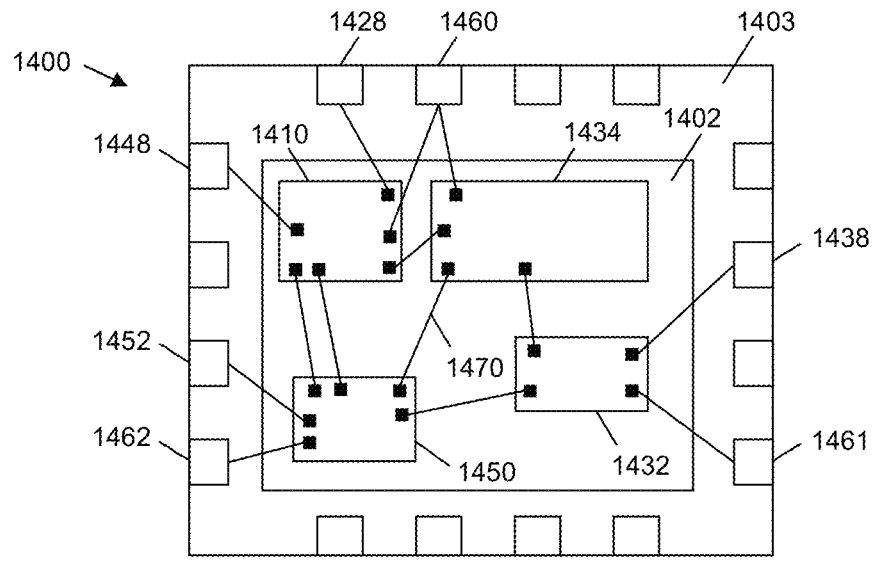
FIG. 14 is a top view of a module that embodies a portion of the RF transceiver system of FIG. 12 or 13, in accordance with an embodiment.

FIG. 14 is a top view of a device 1400 that embodies a portion of the RF transceiver system 1200 of FIG. 12, in accordance with an embodiment. More specifically, FIG. 14 illustrates that portions of the transceiver may be packaged in a surface mount device (SMD) package. More specifically, device 1400 is packaged as a quad flat no-lead (QFN) device, which includes a conductive pad 1402 and a plurality of terminals (e.g., terminals 1428, 1438, 1448, 1452, 1460, 1461, 1462) held in a fixed spatial relationship with non-conductive encapsulation 1403 (e.g., plastic encapsulation). Device 1400 also includes a plurality of ICs coupled to the conductive pad 1402, including an RF switch integrated circuit (IC) 1410 (e.g., an IC that embodies RF switch 1210, FIG. 12), a receive amplifier IC 1432 (e.g., receive amplifier 1232, FIG. 12), a receive matching circuit IC 1434, and an RF switch controller IC 1450 (e.g., an IC that embodies RF switch controller 1250, FIG. 12). In addition, device 1400 includes a transmit signal input terminal 1428 (e.g., corresponding to transmitter node 1228, FIG. 12), a receive signal output terminal 1438 (e.g., corresponding to receiver node 1238, FIG. 12), an antenna terminal 1448 (e.g., corresponding to antenna terminal 1248, FIG. 12), a transmit/receive (TX/RX) control signal terminal 1452, one or more ground terminals 1460, 1461, and one or more power terminals 1462.

The various ICs 1410, 1432, 1434, 1450 and terminals 1428, 1438, 1448, 1452, 1460-1462 are electrically connected together through a plurality of wirebonds (e.g., wirebond 1470). In other embodiments, various ones of the ICs 1410, 1432, 1434, 1450 and terminals 1428, 1438, 1448, 1452, 1460-1462 may be electrically connected together using other conductive structures. In various embodiments, the device 1400 may be housed in an air-cavity package or an overmolded (e.g., encapsulated) package, although the device 1400 may be considered to be complete without such packaging, as well.

After incorporation of device 1400 into a transceiver system (e.g., system 1200, FIG. 12), and during operation of the transceiver system, power and ground reference voltages may be provided to device 1400 through power and ground terminals 1460-1462. RF switch controller IC 1450 may receive transmit/receive mode control signals through a control signal terminal 1452. Based on the received mode control signals, the RF switch controller IC 1450 provides switch control signals to, or "drives", the control terminals (e.g., gates) of various transistors (e.g., transistors within FET stacks 520, 524, 530, 534, 620, 624, 630, 634, 721, 722, 725, 726, 731, 732, 735, 736, 822, 825, 826, 831, 832, 835, FIGS. 5-9) of the RF switch IC 1410. Essentially, the switch control signals determine whether each of the various transistors is in a conducting or non-conducting state at any given time. More specifically, the switch control signals determine whether the RF switch IC 1410 is in a transmit state (i.e., a state in which the switch is configured to convey an RF signal from the transmitter 1220 to the antenna 1240) or a receive state (i.e., a state in which the switch is configured to convey an RF signal from the antenna 1240 to the receiver 1230) at any given time.

When the switch control signals configure the RF switch IC 1410 in the transmit state, transmit signals received by the RF switch IC 1410 from a power amplifier (e.g., power amplifier 1224, FIG. 12) through the transmit signal input terminal 1428 are passed through the RF switch IC 1410 to the antenna terminal 1448. Conversely, when the switch control signals place the RF switch IC 1410 in the receive state, signals received from the antenna terminal 1448 are passed through the RF switch IC 1410 to the receive matching circuit IC 1434. The receive matching circuit IC 1434 may include one or more integrated passive devices (e.g., capacitors, inductors, and/or resistors). The integrated passive devices, along with inductances of the wirebonds 1470 between the receive matching circuit IC 1434, the RF switch IC 1410, and the receive amplifier IC 1432, compose an impedance matching circuit between the RF switch IC 1410 and the receive amplifier IC 1432. In an alternate embodiment, the receive matching circuit IC 1434 may be replaced by discrete components. Either way, the impedance matching circuit also may perform filtering of receive signals that pass from the RF switch IC 1410 to the receive amplifier IC 1432 through the impedance matching circuit. The receive amplifier IC 1432 receives the receive signals from the receive matching circuit IC 1434, and amplifies the receive signals. The receive amplifier IC 1432 then provides the amplified receive signals to receive signal output terminal 1438.

Figure 15:
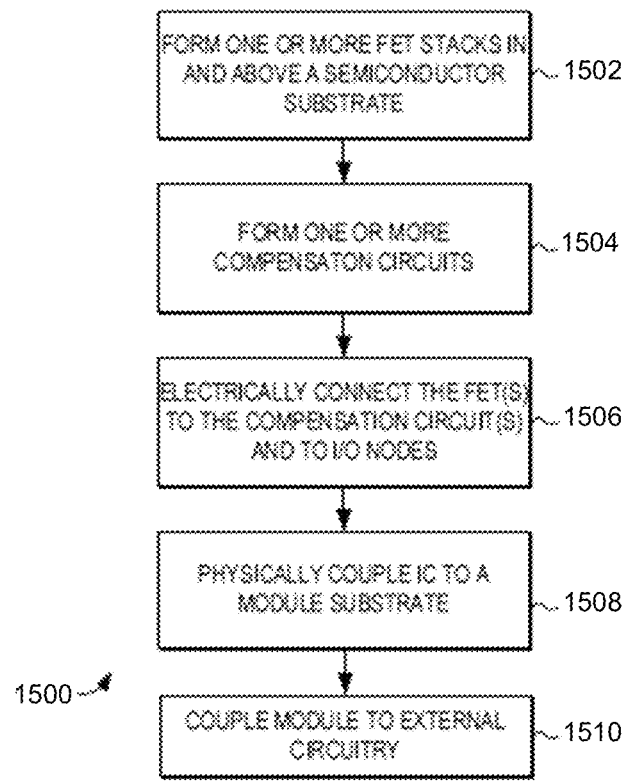
FIG. 15 is a flowchart of a method of fabricating an IC with one or more compensation circuits electrically coupled to FETs in one or more parallel FET stacks, in accordance with an embodiment.

FIG. 15 is a flowchart of a method of fabricating an RF switch (e.g., RF switch 900, FIG. 9) with one or more switch branches having parallel FET stacks, where the parallel FET stacks include one or compensation circuits (e.g., compensation circuits 110, 210, 310, 311, 321, 332, 334, 400, 410, 420, 971-974, 981-984, FIGS. 1, 2, 3A-D, 4A-C, 9, in accordance with various embodiments. According to an embodiment, the various FETs of the RF switch may be formed on an integrated circuit (IC) substrate (e.g., a semiconductor substrate). In a typical IC fabrication process, multiple ICs are fabricated in parallel on a semiconductor wafer, and one of the final fabrication steps includes singulating the individual ICs from the wafer. For simplicity of description, fabrication of a single IC is described below. Those of skill in the art would understand, based on the description herein, that a plurality of ICs may be fabricated simultaneously, as indicated above. Although not specifically pointed out below, when wafer fabrication processes are employed, an IC singulation process may be performed, for example, after block 1504. Similarly, a typical module fabrication process (or IC packaging process) may include simultaneously forming a plurality of modules on a leadframe or PCB, and subsequently singulating each module from the leadframe or PCB. Although also not specifically pointed out below, a module singulation process may be performed, for example, after block 1508.

To facilitate understanding, the below-described method will make reference to fabricating RF switch 900 (FIG. 9). However, those of skill in the art would understand, based on the description herein, that the fabrication embodiments alternatively may be used to fabricate differently configured RF switch ICs or other types of devices altogether. Accordingly, reference to the above-described RF switch IC embodiments should not be construed to limit the scope of the inventive subject matter only to those embodiments.

The method may begin, in block 1502, by forming one or more FETs (e.g., FETs 901-922, FIG. 9) in and above a semiconductor substrate. In some embodiments, multiple FETs may be formed and electrically interconnected as FET stacks. In further embodiments, some of the FET stacks may be formed in parallel between I/O nodes (and/or between I/O nodes and reference nodes). Generally, each FET includes a source terminal, a drain terminal, and a gate terminal. Some or all of the FETs also include a body terminal.

As discussed above, the semiconductor substrate may include any of a variety of different semiconductor substrate materials (e.g., GaAs, GaN, GaN on Si, GaN on SiC, Si, SOI, bulk Si, and so on), and the FET(s) may have any of a variety of different structures (e.g., pHEMT, MOSFET, HEMT, MESFET, LDMOS FET, EMOSFET, JFET, and so on). According to an embodiment, conductive through substrate vias (TSVs) may be formed partially or entirely through the substrate to provide for electrical conductivity between the top and bottom surfaces of the substrate (e.g., between a current conducting terminal of one or more of the FETs and a ground reference node at the bottom of the substrate).

In block 1504, the method may continue by forming one or more compensation circuits (e.g., compensation circuits 110, 210, 310, 311, 321, 332, 400, 410, 420, 971-974, 981-984, FIGS. 1, 2, 3, 4, 9) over the semiconductor substrate. As discussed previously, in various embodiments, the compensation circuits include one or more impedance elements, and various electrical connections between the gates and body terminals of the FETs. The impedance elements may be integrally-formed passive components (e.g., integrally formed capacitors, resistors, varactors, and/or inductors), and/or discrete components (e.g., discrete capacitors, resistors, varactors, and/or inductors), in various embodiments.

In block 1506, the method may continue by electrically coupling the gates and body terminals of FETs to the compensation circuits and to various I/O nodes (e.g., nodes 102, 104, 528, 538, 548, 552, 553, 628, 638, 648, 652, 653,

728, 738, 748, 752, 753, 828, 838, 848, 852, 853, FIGS. 1, 5, 6-9). For example, the electrical connections between the FETs and the compensation circuits may include integrated electrical connections. Ultimately, during operation, electrical signals may be received through some of the nodes from external circuitry, and electrical signals processed through the FET(s) may be provided through others of the nodes to external circuitry. For example, as discussed previously, the nodes may include a first I/O node, a second I/O node, ground reference nodes, and an antenna/circulator node. In addition, the switch drivers (e.g., drivers 1251, 1252, 1351, 1352, FIGS. 12, 13) and other circuitry (e.g., low dropout regulators, charge pumps, etc.) may be integrated into the same IC die as the FETs and compensation circuits.

In block 1508, the IC (e.g., RF switch IC 1410, FIG. 14) is physically coupled to a module substrate (e.g., to module substrate 1402, FIG. 14). In addition, one or more additional ICs and/or components also may be physically coupled to the module substrate.

In block 1510, the IC(s) and components are electrically coupled to each other, and to terminals that are configured to convey signals, power, and ground references between external circuitry and the IC(s)/components of the module. The module substrate configuration, the method of coupling the IC(s) and components to the module's terminals, and the number of ICs within the module defines the module or package type. The module may then be completed (e.g., by encapsulating the module or containing the module in an air cavity package). Once the module is completed, it may be physically and electrically coupled to external circuitry (e.g., other portions of system 1200, 1300, FIGS. 12, 13).

In one embodiment a radio frequency (RF) switch is provided, comprising: a first FET stack coupled between a first node and a second node, the first FET stack including a first series-coupled plurality of field effect transistors (FETs), wherein the first series-coupled plurality of FETs includes: a first FET, the first FET including a first gate and a first body; and second FET, the second FET including a second gate and a second body; and a first compensation circuit electrically coupling the first body and the second gate.

In another embodiment, a radio frequency (RF) switch is provided, comprising: an antenna node; a transmit node; a receive node; a first reference node; a second reference node; a first field effect transistor (FET) stack coupled between the antenna node and the receive node, the first FET stack including a first series-coupled plurality of FETs, each of the first series-coupled plurality of FETs having a gate and a body, the first FET stack including; a first plurality of compensation circuits, each of the first plurality of compensation circuits coupling a gate on one FET in the first series-coupled plurality of FETs to a body on another one of the first series-coupled plurality of FETs; a second FET stack coupled between the transmit node and the first reference node, the second FET stack including a second series-coupled plurality of FETs, each of the second series coupled plurality of FETs having a gate and a body; a second plurality of compensation circuits, each of the second plurality of compensation circuits coupling a gate on one FET in the second series-coupled plurality of FETs to a body on another one of the second series-coupled plurality of FETs; a third FET stack coupled between the transmit node and the antenna node, the third FET stack including a third series-coupled plurality of FETs, each of the third series-coupled plurality of FETs having a gate and a body; and a fourth FET stack coupled between the receive node and the second reference node, the fourth FET stack including a fourth series-coupled plurality of FETs, each of the fourth series coupled plurality of FETs having a gate and a body.

In another embodiment, a method of fabricating a radio frequency (RF) switch is provided, the method comprising: forming a first field effect transistor (FET) stack over an active surface of a semiconductor substrate, the first FET stack including a first series-coupled plurality of field effect transistors (FETs), wherein the first series-coupled plurality of FETs includes: a first FET, the first FET including a first gate and a first body; and a second FET, the second FET including a second gate and a second body; forming a first compensation circuit; and electrically coupling the first compensation circuit to the first body and the second gate.

The foregoing detailed description is merely illustrative in nature and is not intended to limit the embodiments of the subject matter or the application and uses of such embodiments. As used herein, the words "exemplary" and "example" mean "serving as an example, instance, or illustration." Any implementation described herein as exemplary or an example is not necessarily to be construed as preferred or advantageous over other implementations. Furthermore, there is no intention to be bound by any expressed or implied theory presented in the foregoing technical field, background, or detailed description.

For the sake of brevity, conventional semiconductor fabrication techniques may not be described in detail herein. In addition, certain terminology may also be used herein for the purpose of reference only, and thus are not intended to be limiting, and the terms "first", "second" and other such numerical terms referring to structures do not imply a sequence or order unless clearly indicated by the context.

The foregoing description refers to elements or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A switch circuit comprising:
a first port;
a second port;
a first transistor stack coupled between the first and second ports, wherein the first transistor stack comprises a first plurality of transistors coupled in series between the first and second ports to provide a first variably-conductive path between the first and second ports, and wherein each transistor of the first plurality of transistors has a gate terminal coupled to a first control terminal;
a first compensation circuit coupled to the first transistor stack, wherein the first compensation circuit is connected between a body of a first transistor of the first plurality of transistors and a gate terminal of a second transistor of the first plurality of transistors;
a second transistor stack coupled in parallel with the first transistor stack between the first and second ports, wherein the second transistor stack comprises a second plurality of transistors coupled in series between the first and second ports to provide a second variably-conductive path between the first and second ports, and wherein each transistor of the second plurality of transistors has a gate terminal coupled to a second control terminal; and
a second compensation circuit coupled to the second transistor stack, wherein the second compensation circuit is connected between a body of a first transistor of the second plurality of transistors and a gate terminal of a second transistor of the second plurality of transistors.

2. The switch circuit of claim 1, further comprising:
one or more additional first compensation circuits coupled between one or more other pairs of transistors in the first transistor stack; and
one or more additional first compensation circuits coupled between one or more other pairs of transistors in the first transistor stack.

3. The switch circuit of claim 1, wherein compensation circuits are not coupled to at least some of the transistors in the first and second transistor stacks.

4. The switch circuit of claim 1, wherein:
the first compensation circuit is characterized by a first impedance configured to compensate for variations in leakage current across the first plurality of transistors; and
the second compensation circuit is characterized by a second impedance configured to compensate for variations in leakage current across the second plurality of transistors.

5. The switch circuit of claim 1, wherein:
the first compensation circuit and the second compensation circuit each comprises one or more impedance-providing components selected from a capacitor, a varactor, a resistor-capacitor (RC) series circuit, and an active impedance-providing component.

6. The switch circuit of claim 1, wherein:
the first compensation circuit includes a first capacitor; and
the second compensation circuit includes a second capacitor.

7. The switch circuit of claim 1, wherein:
the first compensation circuit includes a first varactor; and
the second compensation circuit includes a second varactor.

8. The switch circuit of claim 1, wherein:
the first compensation circuit includes a first resistor-capacitor (RC) series circuit; and
the second compensation circuit includes a second RC series circuit.

9. The switch circuit of claim 1, wherein:
the first compensation circuit includes a first active impedance-providing component; and
the second compensation circuit includes a second active impedance-providing component.

10. The switch circuit of claim 1, further comprising:
a first driver coupled to the first control terminal; and
a second driver coupled to the second control terminal, where the first and second drivers are configured to simultaneously turn on or turn off the first and second pluralities of transistors.

11. The switch circuit of claim 1, wherein:
the first transistor of the first plurality of transistors is an input-side transistor that is directly coupled to the first port, and
the first transistor of the second plurality of transistors is an input-side transistor that is directly coupled to the first port, and
wherein the switch circuit further comprises
a third compensation circuit coupled to the first transistor stack, wherein the third compensation circuit is connected between a body of the second transistor of the first plurality of transistors and a gate terminal of a third transistor of the first plurality of transistors; and
a fourth compensation circuit coupled to the second transistor stack, wherein the fourth compensation circuit is connected between a body of the second transistor of the second plurality of transistors and a gate terminal of a third transistor of the second plurality of transistors.

12. The switch circuit of claim 1, wherein:
the first and second transistors of the first transistor stack are adjacent to each other; and
the first and second transistors of the second transistor stack are adjacent to each other.

13. The switch circuit of claim 1, further comprising:
a third port;
a third transistor stack coupled between the first and third ports, wherein the third transistor stack comprises a third plurality of transistors coupled in series between the first and third ports, and wherein each transistor of the third plurality of transistors has a gate terminal coupled to a third control terminal;
a fourth transistor stack coupled between the third port and a ground reference node, wherein the fourth transistor stack comprises a fourth plurality of transistors coupled in series between the third port and the ground reference node, and wherein each transistor of the fourth plurality of transistors has a gate terminal coupled to a fourth control terminal; and
a fifth transistor stack coupled between the first port and the ground reference node, wherein the fifth transistor stack comprises a fifth plurality of transistors coupled in series between the first port and the ground reference node, and wherein each transistor of the fifth plurality of transistors has a gate terminal coupled to a fifth control terminal.

14. The switch circuit of claim 1, wherein each transistor of the first and second pluralities of transistors is a field effect transistor.

15. A transceiver comprising:
a switch circuit that includes
a first port,
a second port,
a third port,
a first transistor stack coupled between the first and second ports, wherein the first transistor stack comprises a first plurality of transistors coupled in series between the first and second ports to provide a first variably-conductive path between the first and second ports, and wherein each transistor of the first plurality of transistors has a gate terminal coupled to a first control terminal, a first compensation circuit coupled to the first transistor stack, wherein the first compensation circuit is connected between a body of a first transistor of the first plurality of transistors and a gate terminal of a second transistor of the first plurality of transistors, a second transistor stack coupled in parallel with the first transistor stack between the first and second ports, wherein the second transistor stack comprises a second plurality of transistors coupled in series between the first and second ports to provide a second variably-conductive path between the first and second ports, and wherein each transistor of the second plurality of transistors has a gate terminal coupled to a second control terminal, a second compensation circuit coupled to the second transistor stack, wherein the second compensation circuit is connected between a body of a first transistor of the second plurality of transistors and a gate terminal of a second transistor of the second plurality of transistors, a third transistor stack coupled between the second and third ports, wherein the third transistor stack comprises a third plurality of transistors coupled in series between the second and third ports to provide a third variably-conductive path between the second and third ports, and wherein each transistor of the third plurality of transistors has a gate terminal coupled to a third control terminal.

16. The transceiver of claim 15, wherein:
the first port is coupled to one of a receiver or a transmitter;
the second port is coupled to an antenna; and
the third port is coupled to another one of the transmitter or the receiver.

17. The transceiver of claim 15, further comprising:
a circulator with first, second, and third circulator ports, wherein the first circulator port is coupled to a transmitter, the second circulator port is coupled to the second port of the switch circuit, and the third circulator port is coupled to an antenna.

18. The transceiver of claim 15, further comprising:
one or more additional first compensation circuits coupled between one or more other pairs of transistors in the first transistor stack; and
one or more additional first compensation circuits coupled between one or more other pairs of transistors in the first transistor stack.

19. The transceiver of claim 15, further comprising:
a fourth transistor stack coupled between the first port and a ground reference node, wherein the fourth transistor stack comprises a fourth plurality of transistors coupled in series between the first port and the ground reference node to provide a fourth variably-conductive path between the first port and the ground reference node, and wherein each transistor of the fourth plurality of transistors has a gate terminal coupled to a fourth control terminal; and
a fifth transistor stack coupled between the third port and the ground reference node, wherein the fifth transistor stack comprises a fifth plurality of transistors coupled in series between the third port and the ground reference node to provide a fifth variably-conductive path between the third port and the ground reference node, and wherein each transistor of the fifth plurality of transistors has a gate terminal coupled to a fifth control terminal.

20. The transceiver of claim 19, further comprising:
a switch controller configured to simultaneously configure the first, second, and fifth variably-conductive paths in a low-impedance state, and to configure the third and fourth variably-conductive paths in a high-impedance state.

* * * * *